US011922307B2

(12) United States Patent
Nakago et al.

(10) Patent No.: US 11,922,307 B2
(45) Date of Patent: Mar. 5, 2024

(54) LEARNING DEVICE, INFERENCE DEVICE, AND LEARNED MODEL

(71) Applicants: Preferred Networks, Inc., Tokyo (JP); Tokyo Electron Limited, Tokyo (JP)

(72) Inventors: Kosuke Nakago, Tokyo (JP); Daisuke Motoki, Tokyo (JP); Masaki Watanabe, Tokyo (JP); Tomoki Komatsu, Tokyo (JP); Hironori Moki, Hokkaido (JP); Masanobu Honda, Miyagi (JP); Takahiko Kato, Miyagi (JP); Tomohiko Niizeki, Miyagi (JP)

(73) Assignees: Preferred Networks, Inc., Tokyo (JP); Tokyo Electron Limited, Tokyo (JP)

( * ) Notice: Subject to any disclaimer, the term of this patent is extended or adjusted under 35 U.S.C. 154(b) by 502 days.

(21) Appl. No.: 17/189,608

(22) Filed: Mar. 2, 2021

(65) Prior Publication Data

US 2021/0209413 A1      Jul. 8, 2021

Related U.S. Application Data

(63) Continuation of application No. PCT/JP2019/033168, filed on Aug. 23, 2019.

(30) Foreign Application Priority Data

Sep. 3, 2018    (JP) ................................ 2018-164931

(51) Int. Cl.
     *G06N 3/08*              (2023.01)
     *G06F 18/214*          (2023.01)
     (Continued)

(52) U.S. Cl.
     CPC ............. *G06N 3/08* (2013.01); *G06F 18/214* (2023.01); *G06N 3/04* (2013.01); *G06T 7/0004* (2013.01);
     (Continued)

(58) Field of Classification Search
     CPC ............ G06N 3/08; G06N 3/04; G06N 3/045; G06N 3/048; G06N 20/00; G06F 18/214;
     (Continued)

(56) References Cited

U.S. PATENT DOCUMENTS

| 6,819,427 B1 | 11/2004 | Subramanian et al. |
| 2007/0249182 A1 | 10/2007 | Mani et al. |

(Continued)

FOREIGN PATENT DOCUMENTS

| JP | 2005-202949 | 7/2005 |
| JP | 2015-103769 | 6/2015 |

(Continued)

OTHER PUBLICATIONS

U.S. Appl. No. 17/189,592, filed Mar. 2, 2021, US-2021-0183051-A1, Preferred Networks, Inc.

(Continued)

*Primary Examiner* — Roy M Punnoose
(74) *Attorney, Agent, or Firm* — IPUSA, PLLC

(57) ABSTRACT

With respect to an inference method performed by at least one processor, the method includes inputting, by the at least one processor, into a learned model, non-processed object image data of a second object and data related to a second process for the second object, and inferring, by the at least one processor using the learned model, processed object image data of the second object on which the second process has been performed. The learned model has been trained so that an output obtained in response to non-processed object image data of a first object and data related to a first process for the first object being input approaches processed object image data of the first object on which the first process has been performed.

20 Claims, 16 Drawing Sheets

(51) Int. Cl.
*G06N 3/04* (2023.01)
*G06T 7/00* (2017.01)
*G06V 10/764* (2022.01)
*G06V 10/82* (2022.01)
*G06V 10/32* (2022.01)

(52) U.S. Cl.
CPC ............ *G06V 10/764* (2022.01); *G06V 10/82* (2022.01); *G06T 2207/20084* (2013.01); *G06T 2207/30148* (2013.01); *G06V 10/32* (2022.01)

(58) Field of Classification Search
CPC ......... G06T 7/0004; G06T 2207/20084; G06T 2207/30148; G06V 10/764; G06V 10/82; G06V 10/32; H01L 21/00; H01L 21/02; H01L 21/3065; H01L 21/67011; C23C 14/54; C23C 16/52
USPC ........................................................ 382/145
See application file for complete search history.

(56) References Cited

U.S. PATENT DOCUMENTS

| | | | |
|---|---|---|---|
| 2014/0097362 | A1 | 4/2014 | Carroll |
| 2015/0149970 | A1 | 5/2015 | Kuboi et al. |
| 2017/0194126 | A1* | 7/2017 | Bhaskar ............... G06T 7/0004 |
| 2017/0256466 | A1 | 9/2017 | Bishop et al. |
| 2019/0258169 | A1 | 8/2019 | Wang |
| 2019/0311083 | A1 | 10/2019 | Feng et al. |
| 2020/0104708 | A1* | 4/2020 | Motoki ................... G06N 3/045 |
| 2021/0165374 | A1* | 6/2021 | Kawaharazuka ...... G06N 3/045 |
| 2021/0305070 | A1 | 9/2021 | Kagami et al. |

FOREIGN PATENT DOCUMENTS

| | | |
|---|---|---|
| KR | 2002-0085688 | 11/2002 |
| KR | 10-2004-0080742 | 9/2004 |

OTHER PUBLICATIONS

Ryohei Orihara et al., "Approximation of Time-Consuming Simulation Based on Generative Adversarial Network", 2018 42nd IEEE International Conference on Computer Software & Applications, p. 171-p176.
Ethan Perez et al., "FiLM: Visual Reasoning with a General Conditioning Layer", 2018, Association for the Advancement of Artificial Intelligence. Revised Dec. 18, 2017, <URL:https://arxiv.org/abs/1709.07871>.
Olaf Ronneberger et al."U-Net: Convolutional Networks for Biomedical Image Segmentation", May 27, 2018 version, <URL:https://web.archive.org/web/20180527090545/https://lmb.informatik.uni-freiburg.de/people/ronneber/u-net/>.
Takamitsu Kakinaga et al. "Simulation of Anisotropic Chemical Etching of Single Crystalline Silicon using Cellular—Automata" IEEJ Trans.AM.vol. 124.No.1.2004.
E. Strasser and S. Selberherr"A General Simulation Method for Etching and Deposition Processes" Sep. 1993.
"Predicting plasma in wafer etch and deposition via quantum mechanics", Sep. 15, 2014 version, <URL:https://web.archive.org/web/20140915130427/http://electroiq.com/blog/2011/11/predicting-plasma-in-wafer-etch-and-deposition-via-quantum-mechanics/>Author unlisted.
Jonathan Tompson et al."Accelerating Eulerian Fluid Simulation With Convolutional Networks" Revised Jun. 22, 2017.
Jonathan Tompson et al."Accelerating Eulerian Fluid Simulation With Convolutional Networks", Oct. 18, 2017 version, <URL:https://web.archive.org/web/20171018202802/http://cims.nyu.edu/~schlacht/CNNFluids.htm>.
Justin Gilmer et al."Neural Message Passing for Quantum Chemistry" Revised Jun. 12, 2017.
"Automatic Measurement on Etched Structure in Semiconductor Using Deep Learning Approach" ICLR 2018, Author unlisted.
"General Purpose 1D, 2D Process Simulator" Silvaco Athena, May 19, 2017 version, <URL:https://web.archive.org/web/20170519115933/https://www.silvaco.com/products/tcad/process_simulation/athena/athena.html>Author unlisted.
"2D Core Process Simulator" SSuprem4, May 25, 2017 version, <URL:https://web.archive.org/web/20170525142055/https://www.silvaco.com/products/vwf/athena/ss4/ss4_br.html> Author unlisted.
"An advanced 1D and 2D process simulator" Taurus TSUPREM-4, Oct. 22, 2020 version, <URL:https://web.archive.org/web/20201022182550/https://www.synopsys.com/silicon/tcad/process-simulation/taurus-tsuprem-4.html>Author unlisted.
"Sentaurus Process An advanced 1D, 2D and 3D process simulator" Synopsys, Sep. 19, 2020 version, <URL: https://web.archive.org/web/20200919002904/https://www.synopsys.com/silicon/tcad/process-simulation/sentaurus-process.html >Author unlisted.
Olaf Ronneberger et al. "U-Net: Convolutional Networks for Biomedical Image Segmentation", Revised May 18, 2015, <URL:https://arxiv.org/pdf/1505.04597.pdf>.
G. Erten, A. Gharbi et al. "Using Neural Networks To Control The Process of Plasma Etching and Deposition" Appeared in Proc. of International Conference on Neural Networks, pp. 1091-1096, Jul. 1996,<URL:https://www.researchgate.net/publication/3652150_Using_neural_networks_to_control_the_process_of_plasma_etching_and_deposition>.
Tiffany Wu, Brian Salazar, "Modeling a Deep Reactive Ion Etching (DRIE) Process," <URL:https://nanohub.org/resources/28831.>Aug. 15, 2018.
Modeling DRIE<URL:https://nanohub.org/resources/28831.>Author unlisted, Aug. 15, 2018.
Shim, Seongbo, Shin, Youngsoo "Etch proximity correction through machine-learning-driven etch bias model" SPIE Advanced Lithography, Mar. 23, 2016.
Seongbo Shim, Suhyeong Choi, and Youngsoo Shin "Machine Learning (ML)-Based Lithography Optimizations" 2016 IEEE.
Byungwhan Kim, Duk Woo Lee, and Kwang Ho Kwon "Prediction of etch microtrenching using a neural network", Journal of Applied Physics, AIP Publishing, Submitted: Feb. 23, 2004 . Accepted: Jul. 13, 2004 . Published Online: Sep. 23, 2004.
Office Action dated Dec. 19, 2023 with respect to the related U.S. Appl. No. 17/189,592.

* cited by examiner

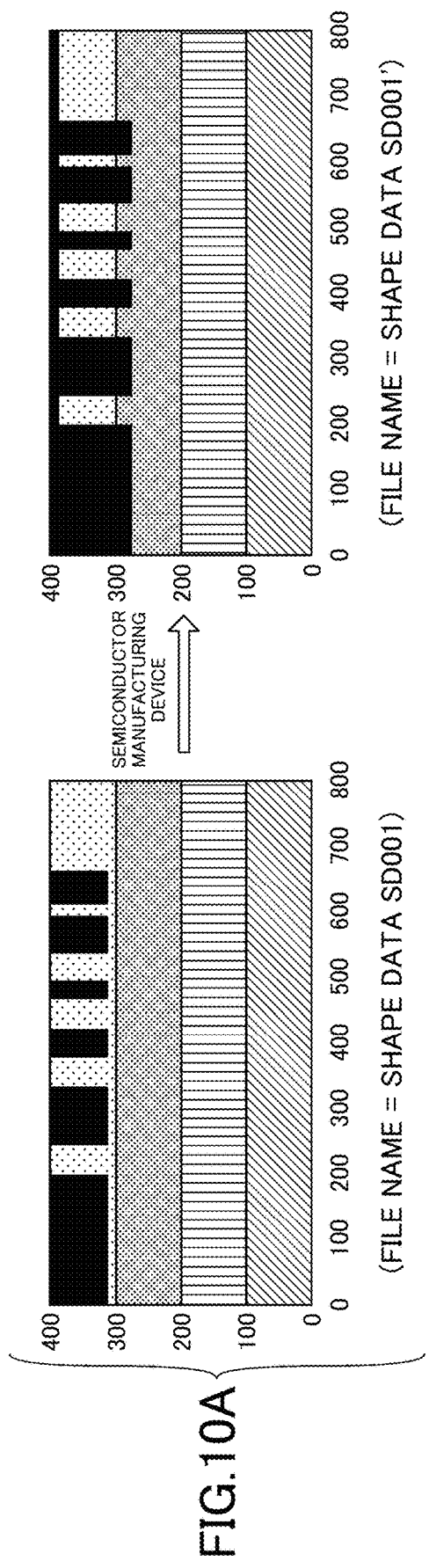
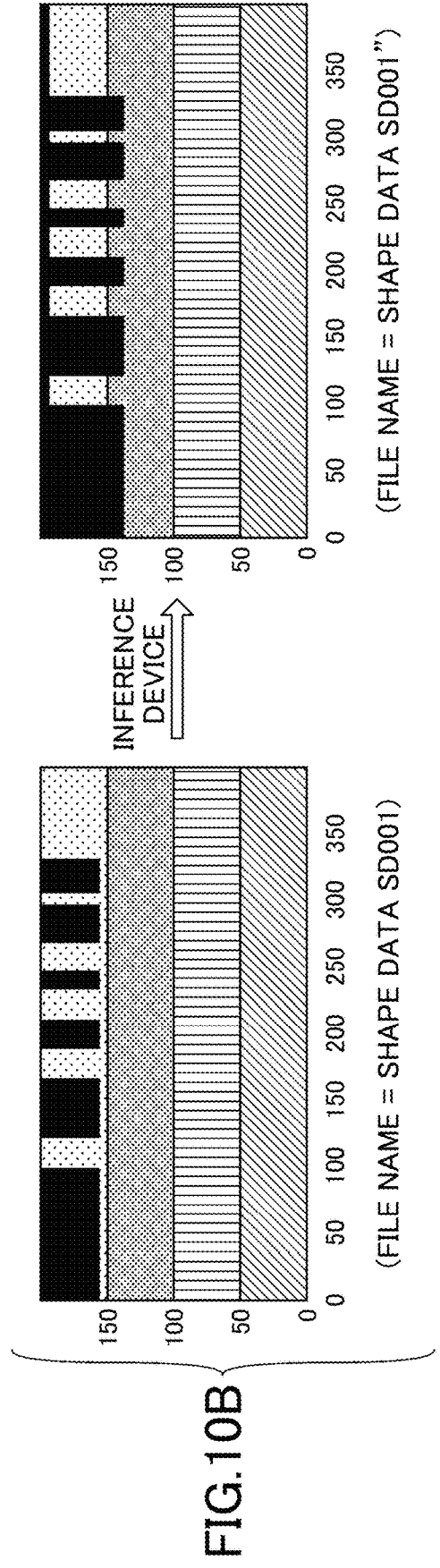
FIG.10A
FIG.10B

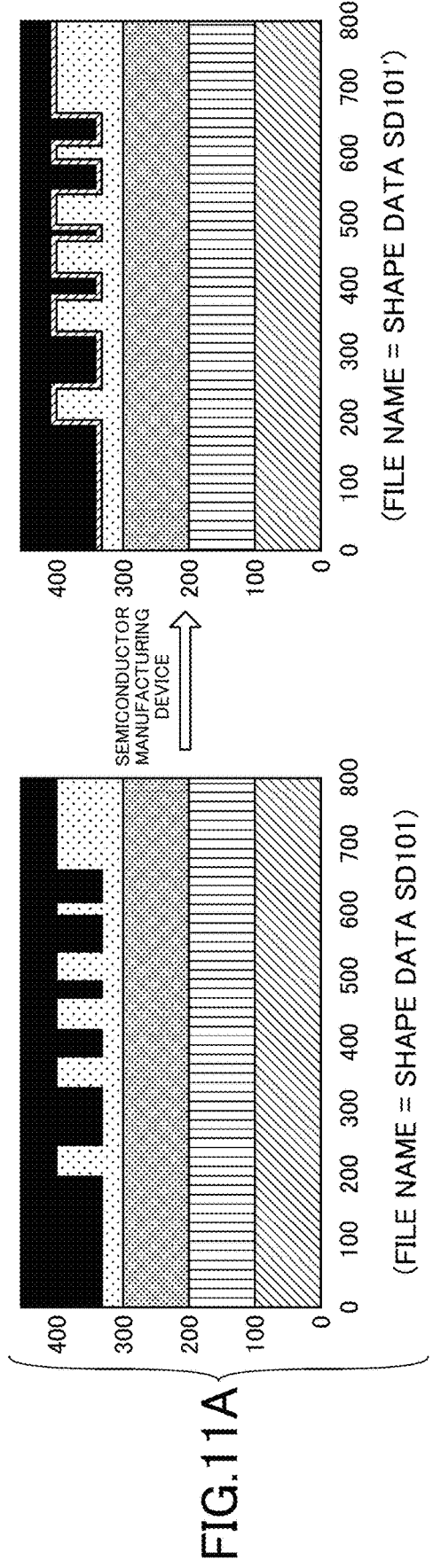
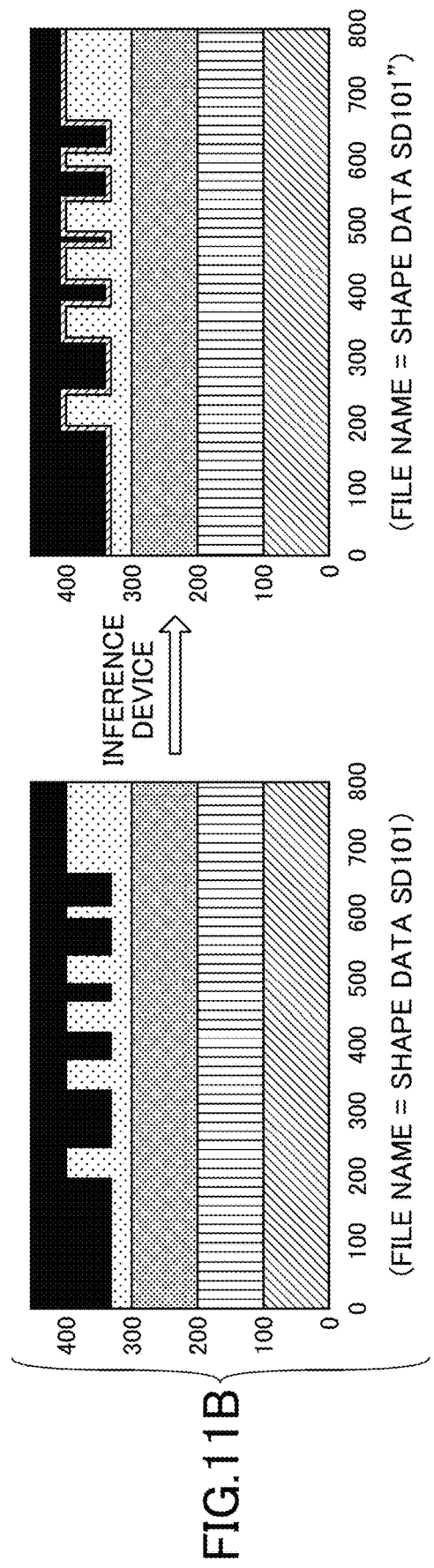

LEARNING DEVICE, INFERENCE DEVICE, AND LEARNED MODEL

CROSS-REFERENCE TO RELATED APPLICATIONS

This application is a continuation application of International Application No. PCT/JP2019/033168 filed on Aug. 23, 2019, and designating the U.S., which is based upon and claims priority to Japanese Patent Application No. 2018-164931, filed on Sep. 3, 2018, the entire contents of which are incorporated herein by reference.

BACKGROUND

1. Technical Field

The disclosure herein relates to a learning device, an inference device, and a learned method.

2. Description of the Related Art

Semiconductor manufacturers generate physical models of respective manufacturing processes (e.g., dry etching and deposition) and perform simulations to search for optimal recipes and to adjust process parameters.

With respect to the above, because the behaviors of semiconductor manufacturing processes are complicated, there are events that cannot be represented by physical models, thereby limiting the accuracy of the simulations. Thus, in recent years, the application of models learned by using machine learning is studied as an alternative to simulators based on physical models.

Here, learned models have an advantage that it is not necessary to define each event in the semiconductor manufacturing process by using a physical equation or the like, as in physical models, and it is expected that simulation accuracy that cannot be achieved by using simulators based on physical models is achieved.

The present disclosure improves the simulation accuracy of the manufacturing process.

SUMMARY

According to one aspect of the present disclosure, with respect to an inference method performed by at least one processor, the method includes inputting, by the at least one processor, into a learned model, non-processed object image data of a second object and data related to a second process for the second object, and inferring, by the at least one processor using the learned model, processed object image data of the second object on which the second process has been performed. The learned model has been trained so that an output obtained in response to non-processed object image data of a first object and data related to a first process for the first object being input approaches processed object image data of the first object on which the first process has been performed.

BRIEF DESCRIPTION OF THE DRAWINGS

FIG. 10A and FIG. 10B are drawings illustrating the simulation accuracy of a dry etching learned model;

FIG. 11A and FIG. 11B are drawings illustrating the simulation accuracy of a deposition learned model;

DETAILED DESCRIPTION

Figure 1:
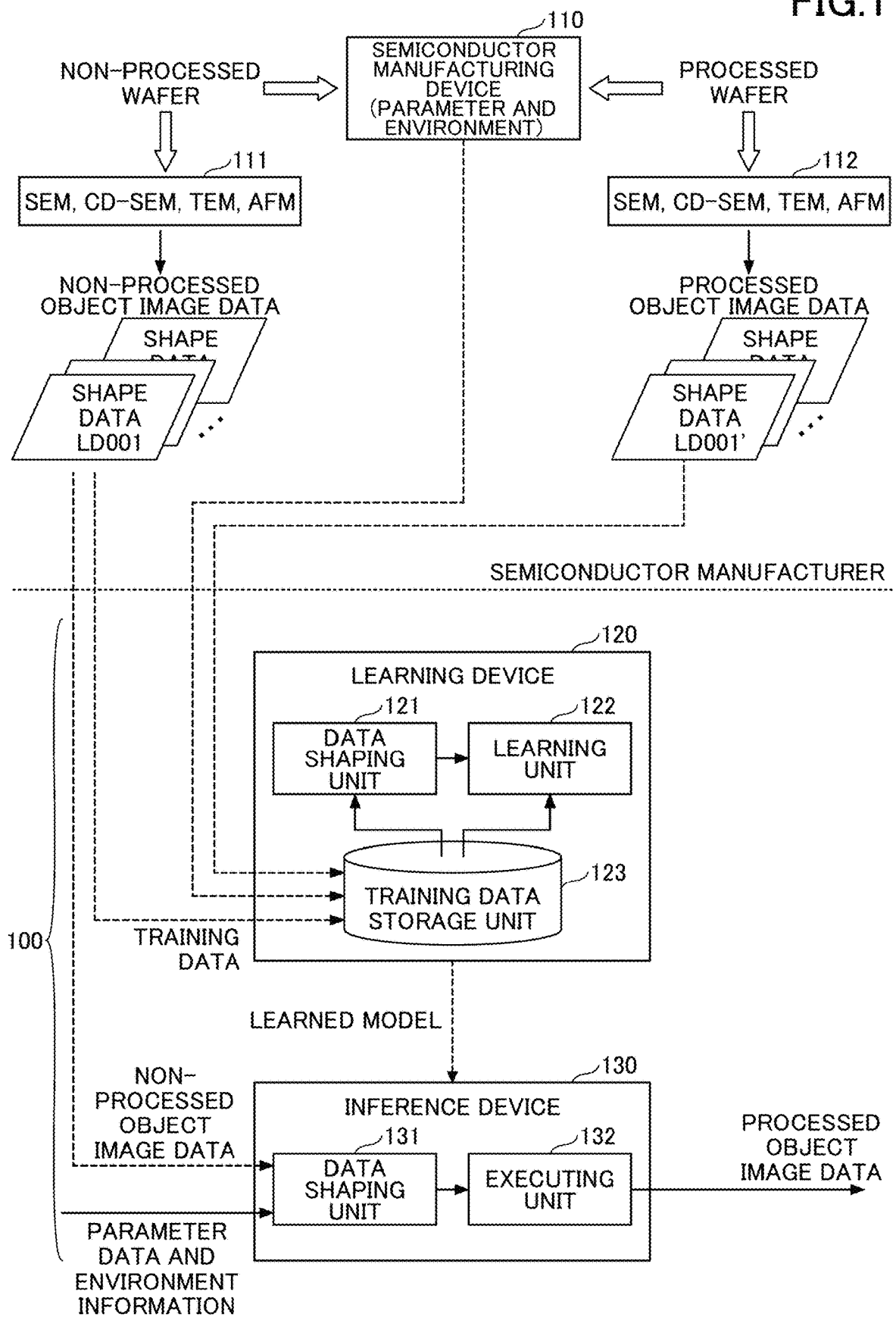
FIG. 1 is a drawing illustrating an example of an overall configuration of a simulation system.

In the following, embodiments will be described in detail with reference to the accompanying drawings. In the present specification and the drawings, components having substantially the same functional configuration are referenced by the same reference numerals, and overlapping description is omitted.

First Embodiment

Overall Configuration of a Simulation System

First, an overall configuration of a simulation system that simulates a semiconductor manufacturing process will be described. FIG. 1 is a drawing illustrating an example of the overall configuration of the simulation system. As illustrated in FIG. 1, a simulation system 100 includes a learning device 120, and an inference device 130. Various data and various information used in the simulation system 100 are obtained from semiconductor manufacturers, databases of semiconductor manufacturing device manufacturers, and the like.

As illustrated in the upper part of FIG. 1, predetermined parameter data (which will be described later in detail) is set in a semiconductor manufacturing device 110. When multiple wafers (objects) to be processed (i.e., non-processed wafers) are transferred, a process corresponding to each manufacturing process (e.g., dry etching or deposition) is performed.

Some non-processed wafers among the multiple non-processed wafers are transferred to a measuring device 111 and the shape is measured by the measuring device 111 at various positions. Then, the measuring device 111 generates, for example, non-processed object image data (i.e., two-dimensional image data) representing a cross-sectional shape at each position of the wafer to be processed. Here, the measuring device 111 includes a scanning electron microscope (SEM), a length scanning electron microscope (CD-SEM), a transmission electron microscope (TEM), an atomic force microscope (AFM), and the like. Further, it is assumed that various metadata such as the magnification ratio of the microscope is associated with the non-processed object image data generated by the measuring device 111.

An example of FIG. 1 indicates a state in which the measuring device 111 generates non-processed object image data having file names of "shape data LD001", "shape data LD002", "shape data LD003", and so on, as the non-processed object image data.

When the process corresponding to each manufacturing process is performed, a processed wafer is transferred from the semiconductor manufacturing device 110. The semiconductor manufacturing device 110 measures the environment during processing when the process corresponding to each manufacturing process is performed on the non-processed wafer, and the semiconductor manufacturing device 110 retains a measurement result as environmental information.

Some processed wafers among multiple processed wafers that are transferred from the semiconductor manufacturing device 110 as the processed wafers are transferred to a measuring device 112 and the shape is measured by the measuring device 112 at various positions. Then, the measuring device 112, for example, generates processed object image data (i.e., two-dimensional image data) representing a cross-sectional shape at each position of the processed wafer. Similarly with the measuring device 111, the measuring device 112 includes a scanning electron microscope (SEM), a length scanning electron microscope (CD-SEM), a transmission electron microscope (TEM), an atomic force microscope (AFM), and the like.

The example of FIG. 1 indicates a state in which the measuring device 112 generates processed object image data having file names of "shape data LD001'", "shape data LD002'", "shape data LD003'", and so on, as the processed object image data.

The non-processed object image data generated by the measuring device 111, the parameter data set to the semiconductor manufacturing device 110 and the environmental information retained by the semiconductor manufacturing device 110, and the processed object image data generated by the measuring device 112 are collected by the learning device 120 as training data. The learning device 120 stores the collected training data in a training data storage unit 123. The parameter data set to the semiconductor manufacturing device 110 and the environmental information retained in the semiconductor manufacturing device 110 are given data relating to a process corresponding to a manufacturing process that the semiconductor manufacturing device 110 performs on the non-processed wafer (object). As described above, the given data related to the process corresponding to the manufacturing process that is performed can be used as the training data, so that factors correlating with events of the manufacturing process can be reflected in machine learning.

A data shaping program and a learning program are installed in the learning device 120, and when the programs are executed, the learning device 120 functions as a data shaping unit 121 and a learning unit 122.

The data shaping unit 121 is an example of a processing unit. The data shaping unit 121 reads the training data stored in the training data storage unit 123 and processes a portion of the read training data into a predetermined format suitable for being input to the learning model by the learning unit 122.

The learning unit 122 performs machine learning on the learning model by using the read training data (which includes the training data processed by the data shaping unit 121) to generate a learned model of the semiconductor manufacturing process. The learned model generated by the learning unit 122 is provided to the inference device 130.

A data shaping program and an execution program are installed in the inference device 130, and when the programs are executed, the inference device 130 functions as a data shaping unit 131 and an executing unit 132.

The data shaping unit 131 is an example of a processing unit. The data shaping unit 131 obtains the non-processed object image data generated by the measuring device 111 and the parameter data and the environmental information input to the inference device 130. The data shaping unit 131 processes the obtained parameter data and the obtained environmental information in a predetermined format suitable for being input into the learned model by the executing unit 132.

The executing unit 132 inputs the non-processed object image data, and the parameter data and the environmental information, processed in the predetermined format in the data shaping unit 131, into the learned model and performs a simulation to output (or performs an inference to obtain) the processed object image data (a simulation result).

A user of the inference device 130 verifies the learned model by contrasting the processed object image data output by the executing unit 132 executing the simulation using the learned model with the corresponding non-processed object image data generated by the measuring device 112.

Specifically, the user of the inference device 130 contrasts the following images:
  the processed object image data output from the executing unit 132 by inputting the non-processed object image data, the parameter data, and the environmental information to the data shaping unit 131
  the processed object image data generated when, after the non-processed wafer is processed by the semiconductor manufacturing device 110, the processed wafer is measured by the measuring device 112

This enables the user of the inference device 130 to calculate the simulation error of the learned model and verify the simulation accuracy.

When the verification is completed, given processed object image data, given parameter data and given environmental information are input to the inference device 130, and various simulations are performed.

Hardware Configuration of Each Device Constituting the Simulation System

Figure 2:
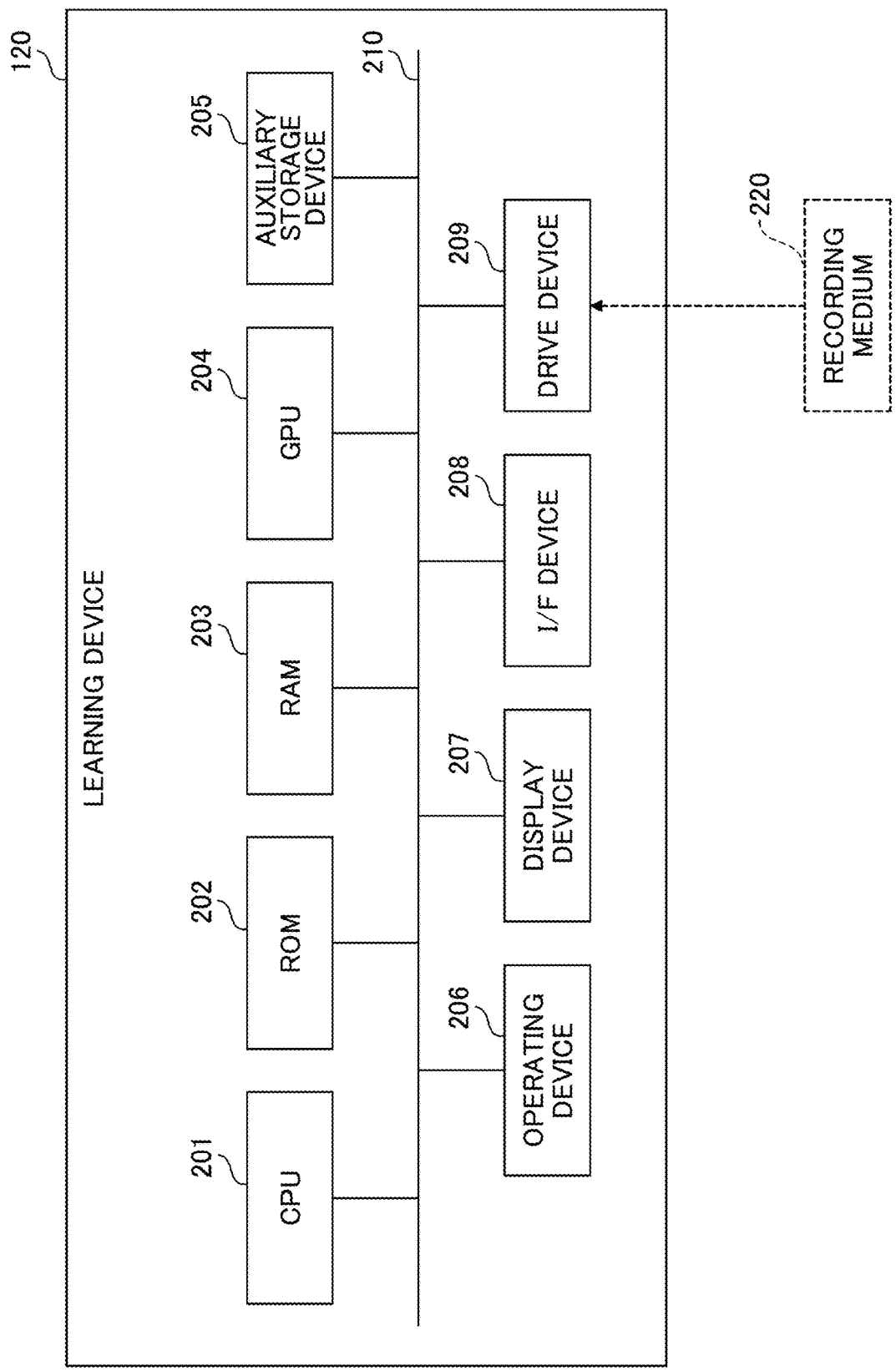
FIG. 2 is a drawing illustrating an example of a hardware configuration of respective devices constituting the simulation system.

Next, a hardware configuration of each device (i.e., the learning device 120 and the inference device 130) constituting the simulation system 100 will be described with reference to FIG. 2. FIG. 2 is a drawing illustrating an example of the hardware configuration of each device constituting the simulation system.

Since the hardware configuration of the learning device 120 is substantially the same as the hardware configuration of the inference device 130, the hardware configuration of the learning device 120 will be described here.

FIG. 2 is a drawing illustrating an example of the hardware configuration of the learning device. As illustrated in FIG. 2, the learning device 120 includes a central processing unit (CPU) 201 and a read only memory (ROM) 202. The learning device 120 also includes a random access memory (RAM) 203 and a graphics processing unit (GPU) 204. The processor (processing circuit or processing circuitry), such as the CPU 201 and the GPU 204, and the memory, such as the ROM 202 and the RAM 203, form what is called a computer.

The learning device 120 further includes an auxiliary storage device 205, an operating device 206, a display device 207, an interface (I/F) device 208, and a drive device 209. Each hardware component of the learning device 120 is interconnected to one another through a bus 210.

The CPU 201 is an arithmetic device that executes various programs (e.g., a data shaping program, a learning program, and the like) installed in the auxiliary storage device 205.

The ROM 202 is a non-volatile memory that functions as a main storage device. The ROM 202 stores various programs, data, and the like that are necessary for the CPU 201 to execute various programs installed in the auxiliary storage device 205. Specifically, the ROM 202 stores a boot program such as Basic Input/Output System (BIOS), Extensible Firmware Interface (EFI), or the like.

The RAM 203 is a volatile memory such as a dynamic random access memory (DRAM) or a static random access memory (SRAM) and functions as a main storage device. The RAM 203 provides a workspace in which various programs installed in the auxiliary storage device 205 are deployed when the various programs are executed by the CPU 201.

The GPU 204 is an arithmetic device for image processing. When various programs are executed by the CPU 201, the GPU 204 performs high-speed arithmetic operations on various image data by Parallel processing.

The auxiliary storage device 205 is a storage unit that stores various programs, various image data on which image processing is performed by the GPU 204 when various programs are executed by the CPU 201, and the like. For example, the training data storage unit 123 is achieved by the auxiliary storage device 205.

The operating device 206 is an input device used when an administrator of the learning device 120 inputs various instructions to the learning device 120. The display device 207 is a display that displays an internal state of the learning device 120. The I/F device 208 is a connection device for connecting and communicating with another device.

The drive device 209 is a device in which a recording medium 220 is set. Here, the recording medium 220 includes a medium that records information optically, electrically, or magnetically, such as a CD-ROM, a flexible disk, a magneto-optical disk, or the like. The recording medium 220 may include a semiconductor memory that electrically records information, such as a ROM, or a flash memory, or the like.

The various programs installed in the auxiliary storage device 205 are installed, for example, when the distributed recording medium 220 is set in the drive device 209 and various programs recorded in the recording medium 220 are read by the drive device 209. Alternatively, various programs to be installed in the auxiliary storage device 205 may be installed by downloading through a network, which is not illustrated.

Description of the Training Data

Figure 3:
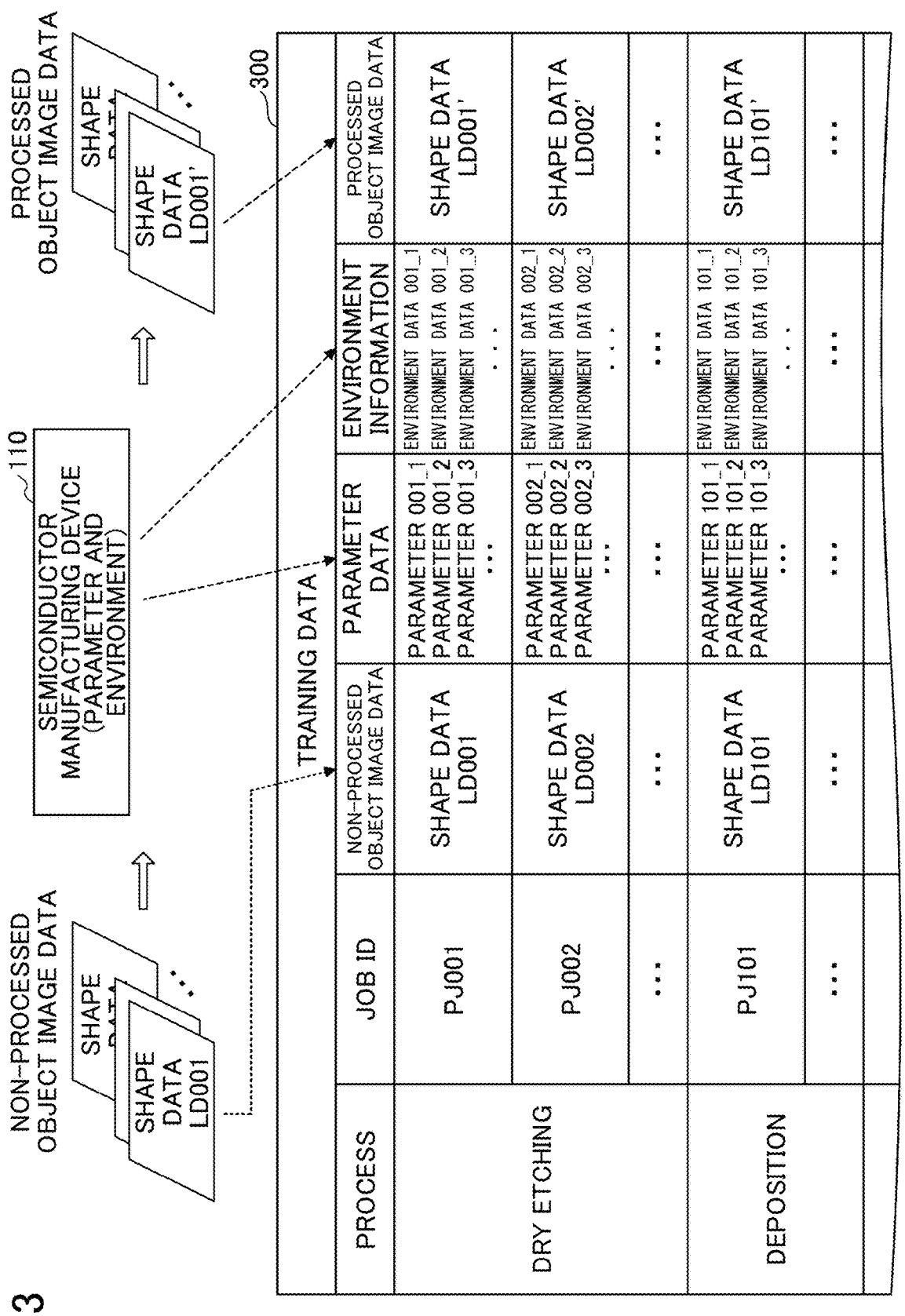
FIG. 3 is a drawing illustrating an example of training data.

Next, the training data stored in the training data storage unit 123 will be described. FIG. 3 is a drawing illustrating an example of the training data. As illustrated in FIG. 3, the training data 300 includes "process", "job ID", "non-processed object image data", "parameter data", and "processed object image data" as items of information.

In the "process", a name indicating the semiconductor manufacturing process is stored. The example of FIG. 3 indicates a state in which two names "dry etching" and "deposition" are stored as the "process".

In the "job ID", an identifier for identifying a job performed by the semiconductor manufacturing device 110 is stored.

The example of FIG. 3 indicates a state in which "PJ001" and "PJ002" are stored as the "job ID" of dry etching. The example of FIG. 3 also indicates a state in which "PJ101" is stored as the "job ID" of deposition.

In the "non-processed object image data", the file name of the non-processed object image data generated by the measuring device 111 is stored. The example of FIG. 3 indicates that when the job ID is "PJ001", the non-processed object image data having a file name of "shape data LD001" is generated by the measuring device 111 for one of the non-processed wafers in a lot (i.e., a wafer group) of the job.

The example of FIG. 3 indicates that when the job ID is "PJ002", the non-processed object image data having a file name of "shape data LD002" is generated by the measuring device 111 for one of the non-processed wafers in a lot (i.e., a wafer group) of the job. Further, the example of FIG. 3 indicates that when the job ID is "PJ101", the non-processed object image data having a file name of "shape data LD101" is generated by the measuring device 111 for one of the non-processed wafers in a lot (i.e., a wafer group) of the job.

In the "parameter data", a parameter representing a predetermined processing condition set when the non-processed wafer is processed in the semiconductor manufacturing device 110 is stored. The example of FIG. 3 illustrates that "parameter 001_1", "parameter 001_2", "parameter 001_3", and so on have been set when the job having job ID of "PJ001" is performed in the semiconductor manufacturing device 110.

For example, "parameter 001_1", "parameter 001_2", "parameter 001_3", and so on include the following:
- data set to the semiconductor manufacturing device 110 as set values, such as pressure (i.e., pressure in a chamber), power (i.e., power of a high-frequency power source), gas (i.e., the gas flow rate), and temperature (i.e., the temperature in the chamber or of a surface of the wafer)
- data set to the semiconductor manufacturing device 110 as target values, such as a critical dimension (CD), depth, the taper angle, the tilting angle, and bowing
- information related to a hardware configuration of the semiconductor manufacturing device 110

In the "environmental information", information indicating the environment during processing of the non-processed wafer that is measured when the non-processed wafer is processed in the semiconductor manufacturing device 110 is stored. The example of FIG. 3 indicates that when the semiconductor manufacturing device 110 performs a process having job ID of "PJ001", "environment data 001_1", "environment data 001_2", "environment data 001_3", and so on are measured as environmental information.

For example, "environment data 001_1", "environment data 001_2", "environment data 001_3", and so on include the following:

- data (mainly data related to a current and voltage) output from semiconductor manufacturing device 110 during processing, such as voltage peak to peak (Vp-p), DC self-bias voltage (Vdc), light emission intensity by optical emission spectroscopy (OES), and reflected wave power (Reflect)
- data measured during processing (mainly data related to light as well as data related to the temperature and pressure), such as plasma density, ion energy, and ion flux In the "processed object image data", a file name of the processed object image data generated by the measuring device 112 is stored. The example of FIG. 3 indicates that when the job ID is "PJ001", the measuring device 112 generates the processed object image data having a file name of "shape data LD001'".

The example of FIG. 3 indicates that when the job ID is "PJ002", the measuring device 112 generates the processed object image data having a file name of "shape data LD002'". Further, the example of FIG. 3 indicates that when the job ID is "PJ101", the measuring device 112 generates the processed object image data having a file name of "shape data LD101'".

Functional Configuration of the Learning Device

Next, functional configurations of respective units (i.e., the data shaping unit 121 and the learning unit 122) of the learning device 120 will be described in detail.

(1) Details of the Functional Configuration of the Learning Unit

Figure 4:
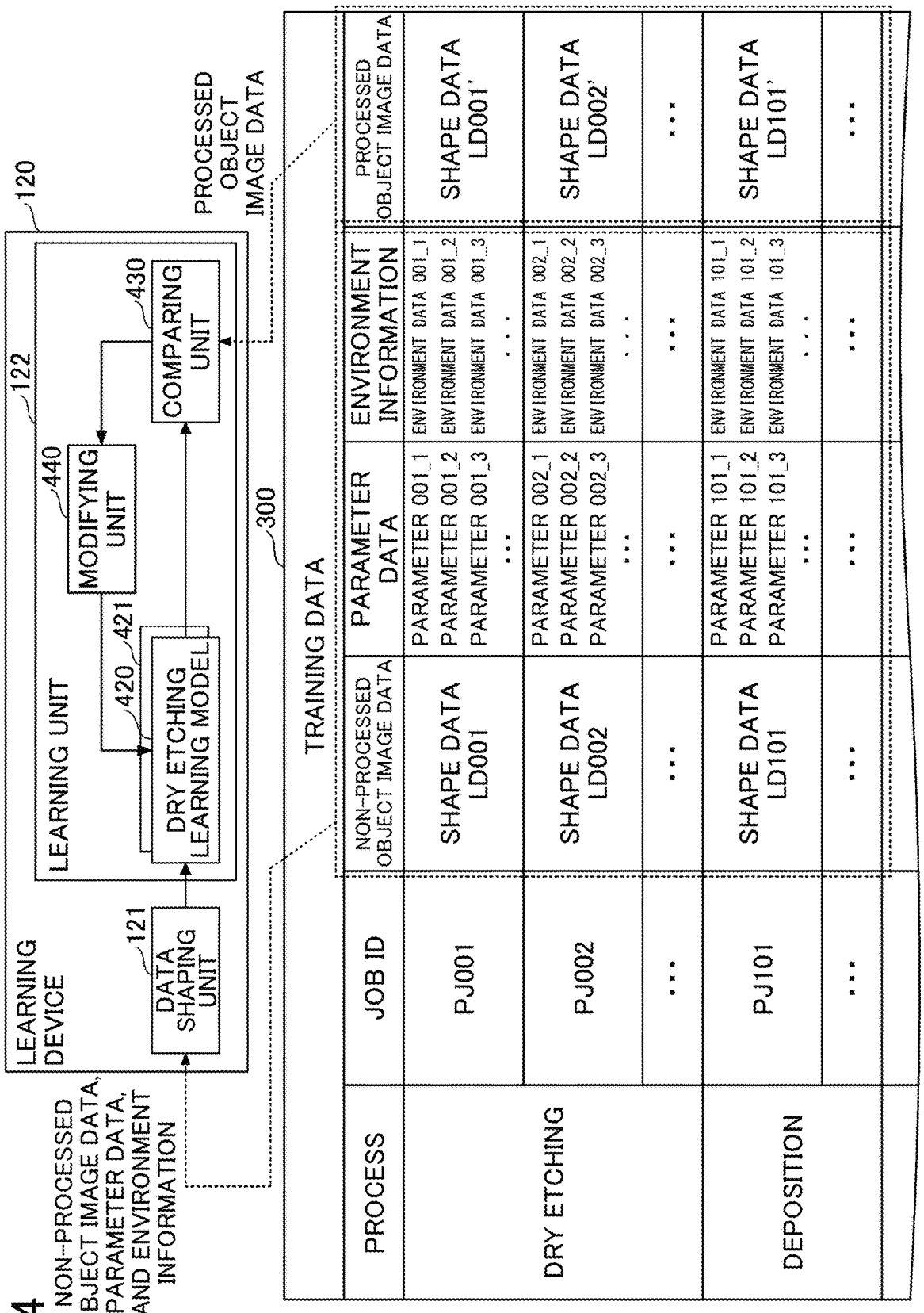
FIG. 4 is a drawing illustrating an example of a functional configuration of a learning unit of a learning device according to a first embodiment.

First, a functional configuration of the learning unit 122 of the learning device 120 will be described in detail. FIG. 4 is a drawing illustrating an example of the functional configuration of the learning unit of the learning device according to the first embodiment. As illustrated in FIG. 4, the learning unit 122 of the learning device 120 includes a dry etching learning model 420, a deposition learning model 421, a comparing unit 430, and a modifying unit 440.

The non-processed object image data, the parameter data, and the environmental information of the training data 300 stored in the training data storage unit 123 are read by the data shaping unit 121 and input to a corresponding learning model. In the present embodiment, the parameter data and the environmental information are processed into a predetermined format by the data shaping unit 121 and input to the corresponding learning model. However, the parameter data and the environmental information may be previously processed into the predetermined format, and data that has been processed into the predetermined format may be read by the data shaping unit 121 and input to the corresponding learning model.

Into the dry etching learning model 420, the non-processed object image data, and the parameter data and the environmental information processed in the predetermined format by the data shaping unit 121 (which are limited to the data to which the "dry etching" of the "process" is associated) are input. When the non-processed object image data, and the parameter data and the environmental information processed into the predetermined format are input, the dry etching learning model 420 outputs an output result. The dry etching learning model 420 inputs the output result to the comparing unit 430.

Similarly, into the deposition learning model 421, the non-processed object image data, and the parameter data and the environmental information processed in the predetermined format by the data shaping unit 121 (which are limited to the data to which the "deposition" of the "process" is associated) are input. When the non-processed object image data, and the parameter data and the environmental information processed in the predetermined format are input, the deposition learning model 421 outputs an output result. The deposition learning model 421 inputs the output result to the comparing unit 430.

The comparing unit 430 compares the output result input from the dry etching learning model 420 with the processed object image data of the training data 300 (i.e., the processed object image data to which the "dry etching" of the "process" is associated) and notifies the modifying unit 440 of differential information.

Similarly, the comparing unit 430 compares the output result input from the deposition learning model 421 with the processed object image data of the training data 300 (i.e., the processed object image data to which the "deposition" of the "process" is associated) and notifies the modifying unit 440 of differential information.

The modifying unit 440 updates a model parameter of the dry etching learning model 420 or the deposition learning model 421 based on the respective differential information notified by the comparing unit 430. The differential information used to update the model parameter may be a squared error or an absolute error.

As described above, the learning unit 122 inputs the non-processed object image data, and the parameter data and the environmental information processed in the predetermined format into the learning model and updates the model parameter by using machine learning so that the output result output from the learning model approaches the processed object image data.

This enables the learning unit 122 to reflect the processed object image data in which the effect of each event in the semiconductor manufacturing process appears in machine learning and to perform machine learning of a relationship between these events, and the parameter data and the environmental information.

(2) Details of the Functional Configuration of the Data Shaping Unit

Figure 5:
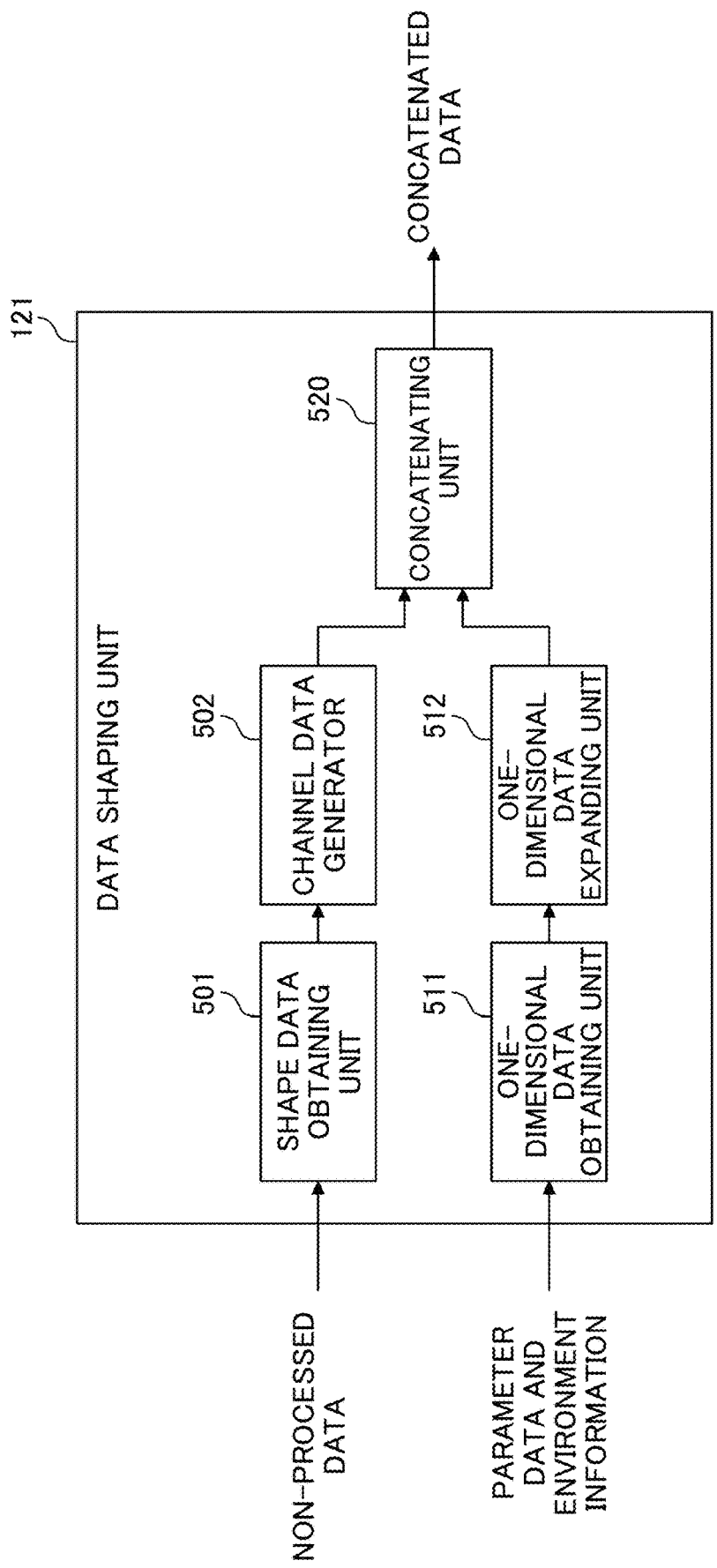
FIG. 5 is a drawing illustrating an example of a functional configuration of a data shaping unit of the learning device according to the first embodiment.

Next, the functional configuration of the data shaping unit 121 of the learning device 120 will be described in detail. FIG. 5 is a drawing illustrating an example of the functional configuration of the data shaping unit of the learning device according to the first embodiment. As illustrated in FIG. 5, the data shaping unit 121 includes a shape data obtaining unit 501, a channel data generator 502, a one-dimensional data obtaining unit 511, a one-dimensional data expanding unit 512, and a concatenating unit 520.

The shape data obtaining unit 501 reads the processed object image data of the training data 300 from the training data storage unit 123 and notifies the channel data generator 502.

The channel data generator 502 is an example of a generator. The channel data generator 502 obtains the non-processed object image data notified by the shape data obtaining unit 501 (here, it is assumed that the image data is represented by pixel values corresponding to the composition ratio (or the content ratio) of each material). The channel data generator 502 generates image data having multiple channels corresponding to types of the materials from the obtained non-processed object image data. Hereinafter, the image data having the channels corresponding to the types of the materials is referred to as the channel data. For example, the channel data generator 502 generates channel data including an air layer and four channel data respectively including four material layers from the non-processed object image data.

The channel data generator 502 notifies the concatenating unit 520 of the generated multiple channel data. In the present embodiment, although the channel data generator 502 generates the channel data, the channel data may be previously generated. In this case, the channel data generator 502 reads the previously generated channel data and notifies the concatenating unit 520.

The one-dimensional data obtaining unit 511 reads the parameter data and the environmental information of the training data 300 from the training data storage unit 123 and notifies the one-dimensional data expanding unit 512.

The one-dimensional data expanding unit 512 processes the parameter data and the environmental information notified from the one-dimensional data obtaining unit 511 into a predetermined format in accordance with the size of the non-processed object image data (i.e., a format of a two-dimensional array in accordance with the width and the height of the non-processed object image data).

Here, in the parameter data, numerical values of parameters such as "parameter 001_1", "parameter 001_2", "parameter 001_3", and so on are arranged in one dimension. Specifically, in the parameter data, numerical values of N types of parameters are arranged in one dimension.

Thus, the one-dimensional data expanding unit 512 extracts a numerical value of one of the N types of parameters included in the parameter data one by one, and arranges the extracted numerical values in two dimensions in accordance with the width and the height of the non-processed object image data. As a result, the one-dimensional data expanding unit 512 generates N parameter data respectively arranged in two dimensions.

The one-dimensional data expanding unit 512 notifies the concatenating unit 520 of the N parameter data respectively arranged in two dimensions.

Similarly, in the environmental information, for example, numerical values of environmental information, such as "environment data 001_1", "environment data 001_2", "environment data 001_3", and so on are arranged in one dimension. Specifically, numerical values of M types of the environmental data are arranged in one dimension.

Thus, the one-dimensional data expanding unit 512 extracts a numerical value of one of M types of environmental data included in the environmental information one by one, and arranges the extracted numerical values in two dimensions in accordance with the width and the height of the non-processed object image data. As a result, the one-dimensional data expanding unit 512 generates M environmental information respectively arranged in two dimensions.

The one-dimensional data expanding unit 512 notifies the concatenating unit 520 of the M environmental information respectively arranged in two dimensions.

The concatenating unit 520 concatenates N parameter data and M environmental information respectively arranged in two dimensions notified by the one-dimensional data expanding unit 512 to the multiple channel data notified by the channel data generator 502 as new channels and generates the concatenated data. In the present embodiment, the concatenating unit 520 generates the concatenated data, but the concatenated data may have been previously generated. In this case, the concatenating unit 520 reads the previously generated concatenated data and inputs the concatenated data into the learning model.

Specific Example of a Process Performed by Each Unit of the Learning Device

Next, a specific example of a process performed by the above-described data shaping unit 121 and a process performed by the dry etching learning model 420 in the learning unit 122 among the respective units of the learning device 120 will be described.

(1) Specific Example of the Process Performed by the Data Shaping Unit

Figure 6:
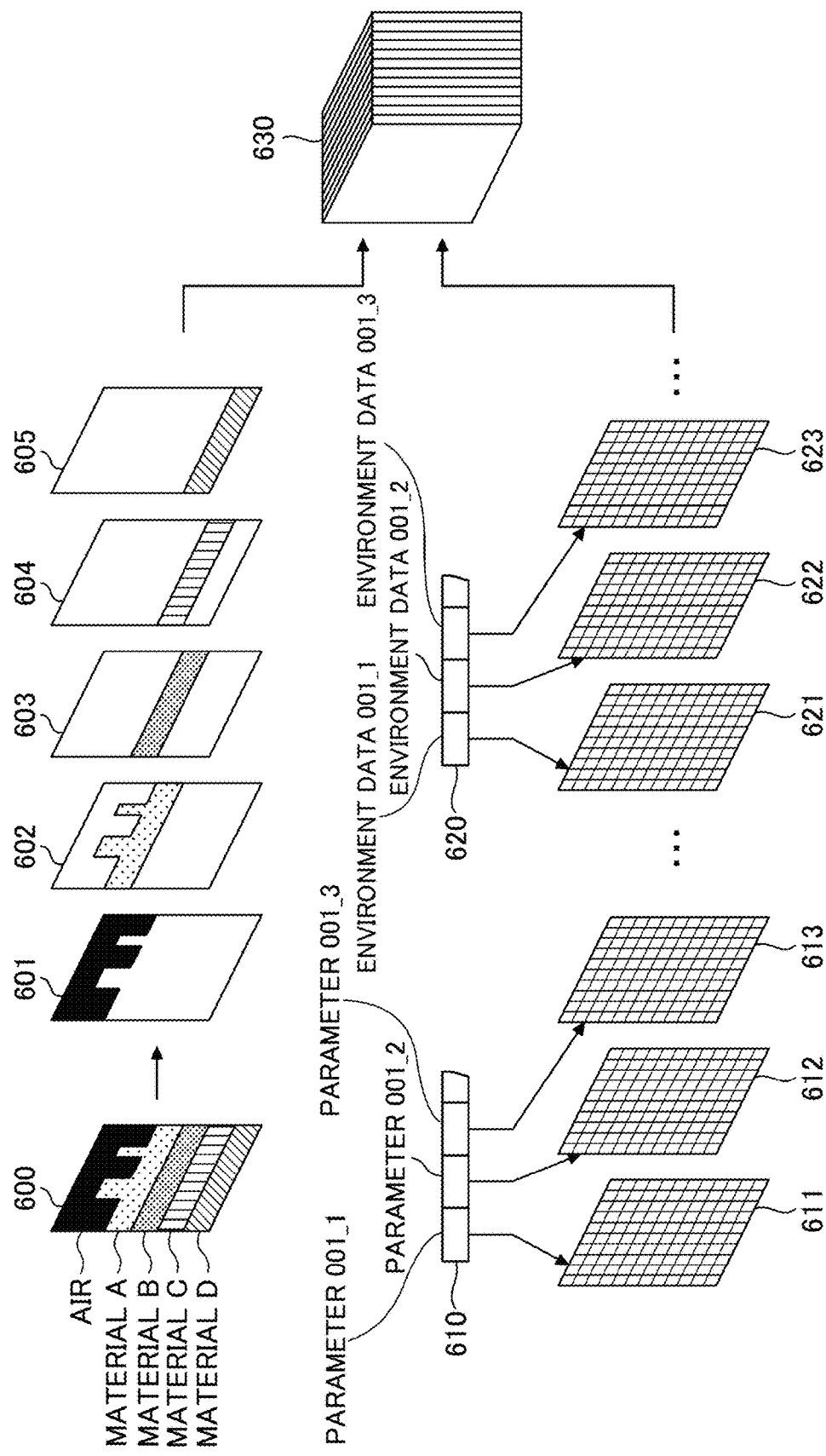
FIG. 6 is a drawing illustrating a specific example of a process performed by the data shaping unit of the learning device according to the first embodiment.

FIG. 6 is a drawing illustrating a specific example of the process performed by the data shaping unit. In FIG. 6, the non-processed object image data 600 is, for example, non-processed object image data having a file name of "shape data LD001".

As illustrated in FIG. 6, the non-processed object image data 600 includes a layer of air, a layer of a material A, a layer of a material B, a layer of a material C, and a layer of a material D. In this case, the channel data generator 502 generates channel data 601, 602, 603, 604, and 605.

As illustrated in FIG. 6, in parameter data 610, for example, numerical values of respective parameters (e.g., "parameter 001_1", "parameter 001_2", "parameter 001_3", and so on) are arrayed in one dimension.

Further, as illustrated in FIG. 6, in the environmental information 620, for example, numerical values of respective environment data (e.g., "environment data 001_1", "environment data 001_2", "environment data 001_3", and so on) are arrayed in one dimension.

In this case, the one-dimensional data expanding unit 512 arrays the parameter 001_1 in two dimensions (i.e., the one-dimensional data expanding unit 512 arrays the same values vertically and horizontally) in accordance with the width and the height of the non-processed object image data 600. Similarly, the one-dimensional data expanding unit 512 arrays the parameter 001_2 in two dimensions in accordance with the width and the height of the non-processed object image data 600. Similarly, the one-dimensional data expanding unit 512 arrays the parameter 001_3 in two dimensions in accordance with the width and the height of the non-processed object image data 600.

The one-dimensional data expanding unit 512 arrays the environment data 001_1 in two dimensions (i.e., the one-dimensional data expanding unit 512 arrays the same values vertically and horizontally) in accordance with the width and the height of the non-processed object image data 600. Similarly, the one-dimensional data expanding unit 512 arrays the environment data 001_2 in two dimensions in accordance with the width and the height of the non-processed object image data 600. Similarly, the one-dimensional data expanding unit 512 arrays the environment data 001_3 in two dimensions in accordance with the width and the height of the non-processed object image data 600.

Parameter data 611, 612, 613, and so on arrayed in two dimensions and environmental information 621, 622, 623, and so on arrayed in two dimensions are concatenated by the concatenating unit 520 as new channels with the channel data 601, 602, 603, 604, and 605, and concatenated data 630 is generated.

Figure 7:
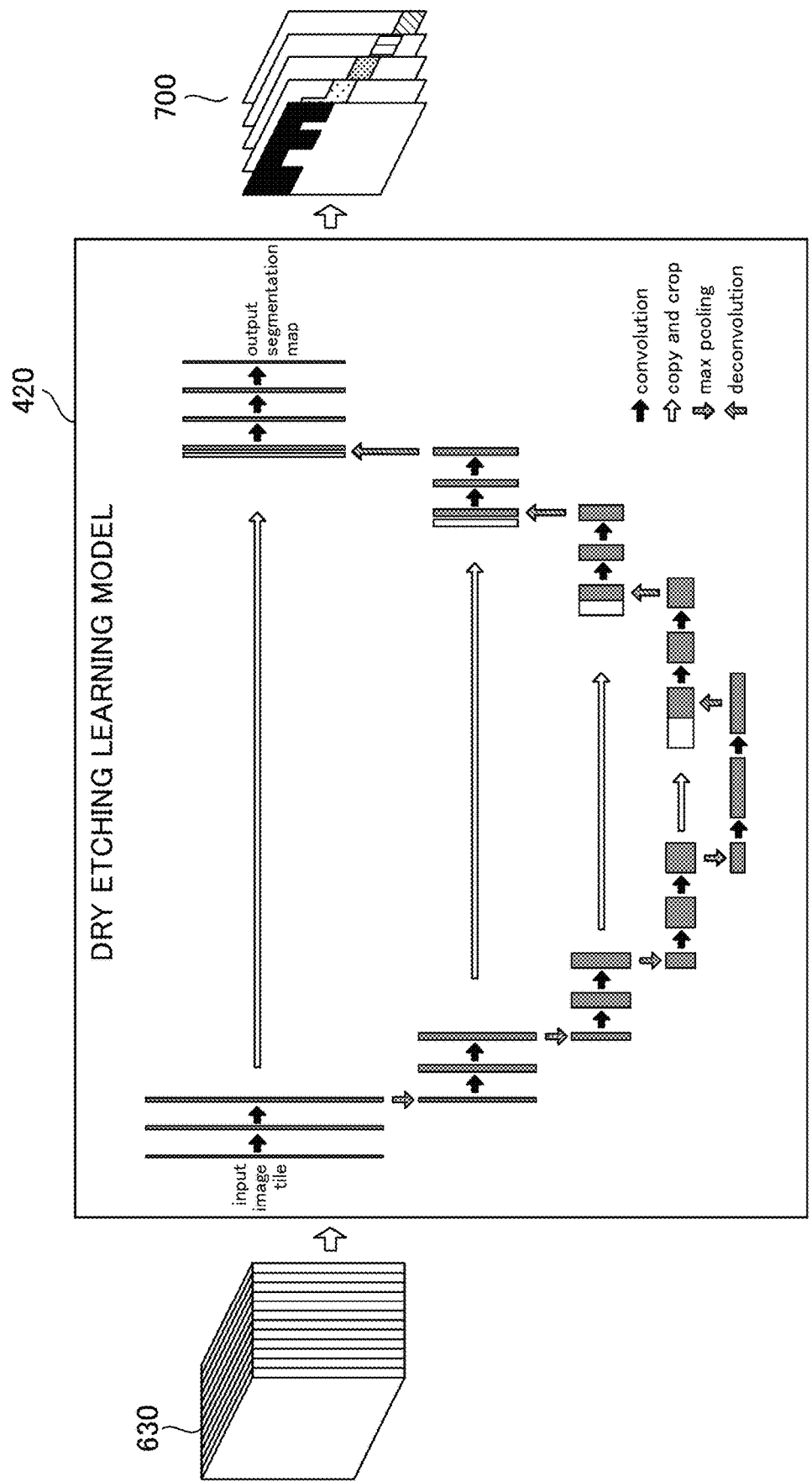
FIG. 7 is a drawing illustrating a specific example of a process performed by a dry etching learning model of the learning device according to the first embodiment.

(2) Specific Example of a Process Performed Using the Dry Etching Learning Model Next, a specific example of a process performed using the dry etching learning model 420 in the learning unit 122 will be described. FIG. 7 is a drawing illustrating a specific example of the process performed using the dry etching learning model of the learning device according to the first embodiment. As illustrated in FIG. 7, in the present embodiment, a learning model based on a U-shaped convolutional neural network (CNN) (which is what is called UNET) is used as the dry etching learning model 420.

When the UNET is used, typically, image data is input and image data is output. Thus, the UNET is used as a learning model of the learning unit 122, so that non-processed object image data of the semiconductor manufacturing process can be input and the processed object image data of the semiconductor manufacturing process can be output.

With respect to the above, when the UNET is used, data that is not in an image data format is required to be processed into an image data format. The one-dimensional data expanding unit 512 of the data shaping unit 121 described above is configured to array the parameter data and the environment data in two dimensions in order to process the data to be input to the UNET into an image data format. The parameter data and the environmental information can be input to the UNET, so that machine learning can be performed using factors correlating with events of the dry etching.

The example of FIG. 7 illustrates a state in which the concatenated data 630 is input to the dry etching learning model 420 using the UNET, and an output result 700 including multiple channel data is output.

Here, in the example of FIG. 7, a specific example of the process performed by using the dry etching learning model 420 is illustrated. However, a specific example of the process performed by using the deposition learning model 421 is substantially the same.

Flow of a Learning Process

Figure 8:
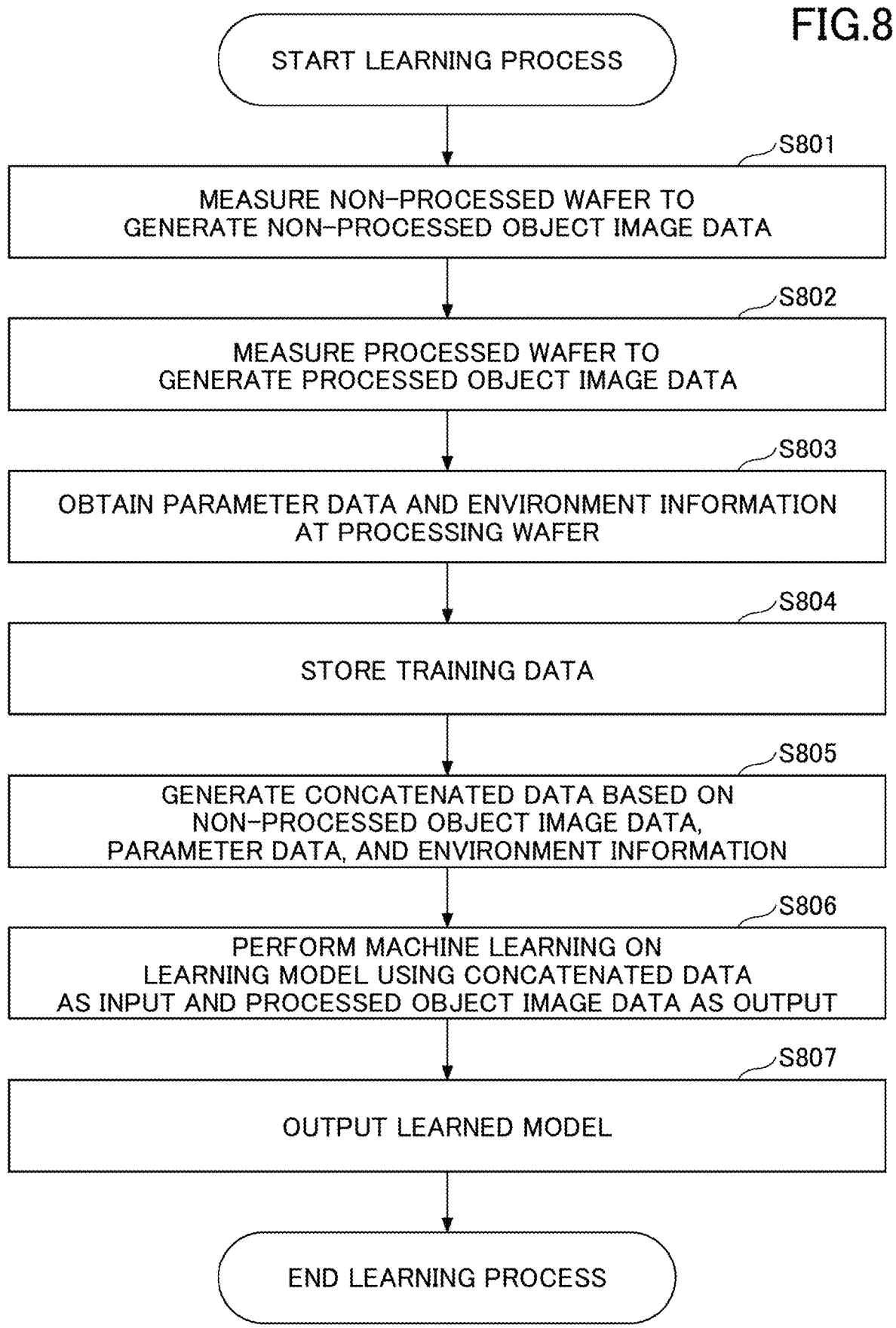
FIG. 8 is a flowchart illustrating a flow of a learning process.

Next, a flow of a learning process will be described. FIG. 8 is a flowchart illustrating the flow of the learning process.

In step S801, the measuring device 111 measures the shape of the non-processed wafer to be processed by the semiconductor manufacturing device 110 at various positions and generates the non-processed object image data.

In step S802, the measuring device 112 measures the shape of the wafer processed by the semiconductor manufacturing device 110 at various positions and generates the processed object image data.

In step S803, the learning device 120 obtains the parameter data set to the semiconductor manufacturing device 110 and the environmental information obtained by measuring the environment during processing when the semiconductor manufacturing device 110 performs the process corresponding to each manufacturing process.

In step S804, the learning device 120 stores the non-processed object image data generated by the measuring device 111, the processed object image data generated by the measuring device 112, and the parameter data and the environmental information that are obtained in the training data storage unit 123 as training data.

In step S805, the data shaping unit 121 of the learning device 120 reads the non-processed object image data, the parameter data, and the environmental information from the training data storage unit 123 and generates the concatenated data.

In step S806, the learning unit 122 of the learning device 120 performs machine learning on the learning model by using the concatenated data as an input and the processed object image data as an output, and generates a learned model.

In step S807, the learning unit 122 of the learning device 120 transmits the generated learned model to the inference device 130.

Functional Configuration of the Inference Device

Next, a functional configuration of the inference device 130 will be described in detail. In respective units of the inference device 130 (i.e., the data shaping unit 131 and the executing unit 132), the details of the functional configuration of the data shaping unit 131 are substantially the same as the details of the functional configuration of the data shaping unit 121 of the learning device 120. Thus, description of the functional configuration of the data shaping unit 131 will be omitted here, and the functional configuration of the executing unit 132 will be described in detail below.

Figure 9:
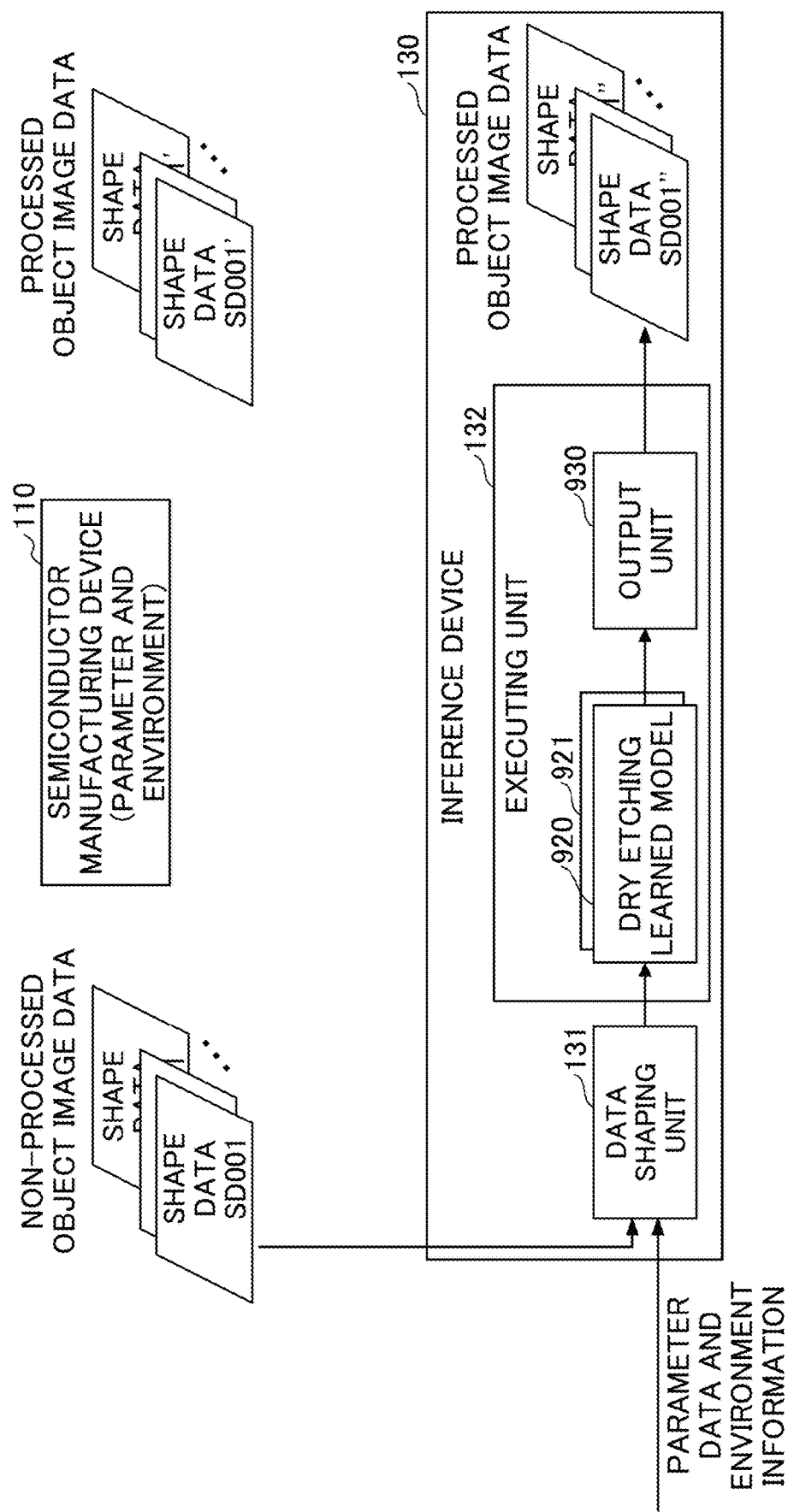
FIG. 9 is a drawing illustrating an example of a functional configuration of an executing unit of an inference device.

FIG. 9 is a drawing illustrating an example of the functional configuration of the executing unit of the inference device. As illustrated in FIG. 9, the executing unit 132 of the inference device 130 includes a dry etching learned model 920, a deposition learned model 921, and an output unit 930.

When the non-processed object image data generated by the measuring device 111 (e.g., data that is not used for machine learning) is obtained, and the parameter data and the environmental data are input to the inference device 130, the data shaping unit 131 generates the concatenated data. The data shaping unit 131 inputs the concatenated data to the corresponding learned model. The example of FIG. 9 illustrates a state in which non-processed object image data having file names of "shape data SD001", "shape data SD002", . . . , so on is obtained as the non-processed object image data generated by the measuring device 111.

The dry etching learned model 920 performs a simulation in response to the concatenated data being input by the data shaping unit 131. The dry etching learned model 920 notifies the output unit 930 of an output result that is output by performing the simulation.

Similarly, the deposition learned model 921 performs a simulation in response to the concatenated data being input by the data shaping unit 131. The deposition learned model 921 notifies the output unit 930 of an output result that is output by performing the simulation.

Here, the non-processed object image data generated by the measuring device 111 is input. However, any non-processed object image data can be input to the dry etching learned model 920 and the deposition learned model 921.

The output unit 930 generates processed object image data (e.g., image data having a file name of "shape data SD001'") from the output result notified from the dry etching learned model 920 and outputs the processed object image data as a simulation result. Similarly, the output unit 930 generates processed image data (e.g., image data having a file name of "shape data SD101'") from the output result notified from the deposition learned model 921, and outputs the processed object image data as a simulation result.

Here, it is assumed that the user of the inference device 130 inputs the parameter data and the environmental information that are the same as the parameter data set to the semiconductor manufacturing device 110 and the environmental information retained by the semiconductor manufacturing device 110. In this case, the user of the inference device 130 can contrast the processed object image data output from the output unit 930 and the processed object image data generated from the measuring device 112 (e.g., the image data having a file name of "shape data SD001'"). As a result, the user of the inference device 130 can verify the simulation accuracy of the inference device 130.

FIG. 10A and FIG. 10B are drawings illustrating the simulation accuracy of the dry etching learned model. FIG. 10A illustrates the non-processed object image data generated by the measuring device 111 (i.e., the image data having a file name of "shape data SD001"), and the processed object image data generated by the measuring device 112 (i.e., the image data having a file name of "shape data SD001'") as a comparison target.

With respect to the above, FIG. 10B illustrates the non-processed image object data (i.e., the image data having a file name of "shape data SD001'") and the processed image data (i.e., the image data having a file name of "shape data SD001''") obtained when the simulation is performed by using the dry etching learned model 920.

When the processed object image data of FIG. 10A (i.e., the image data having a file name of "shape data SD001'") and the processed object image data of FIG. 10B (i.e., the image data having a file name of "shape data SD001''") are contrasted, there is no difference between them. Thus, the dry etching learned model 920 can achieve a highly accurate simulation for the dry etching performed by the semiconductor manufacturing device 110.

Similarly, FIG. 11A and FIG. 11B are drawings illustrating the simulation accuracy of the deposition learned model. FIG. 11A illustrates the non-processed object image data generated by the measuring device 111 (i.e., the image data having a file name of "shape data SD101") and the processed object image data generated by the measuring device 112 (i.e., the image data having a file name of "shape data SD101'") as a comparison target.

With respect to the above, FIG. 11B illustrates the non-processed object image data (i.e., the image data having a file name of "shape data SD101") and the processed object image data (i.e., the image data having a file name of "shape data SD101''") obtained when the simulation is performed by using the deposition learned model 921.

When the processed object image data of FIG. 11A (i.e., the image data having a file name of "shape data SD101'") and the processed object image data of FIG. 11B (i.e., the image data having a file name of "shape data SD101''") are contrasted, there is no difference between them. Thus, the deposition learned model 921 can achieve a highly accurate simulation for the deposition performed by the semiconductor manufacturing device 110.

Here, in each learned model of the executing unit 132, the simulation accuracy can be improved in comparison with a general physical model (i.e., a model in which a semiconductor manufacturing process is identified based on a physical law).

This is because, in a general physical model, each event that cannot be represented by a physical equation cannot be reflected in a simulation, but in a learning model, each event that causes an effect appears in the processed object image data can be reflected in machine learning. Additionally, in the learning model according to the present embodiment, since factors correlating with events in the semiconductor manufacturing process (i.e., the parameter data and the environmental information) are input, machine learning can be performed on the relationship between events and factors.

Here, each event that cannot be represented by the physical equation includes, for example, an event in which the gas in a chamber becomes non-uniform in the dry etching. Additionally, an event in which etched particles adhere as deposition and the like are included. In the deposition, for example, an event in which particles are rebounded one or more times and then adhere and the like are included.

For these events, in a general physical model, the gas in a chamber is treated as uniform during dry etching. Also, in a general physical model, particles are treated as adhering to a first contact point during deposition.

With respect to the above, in a learned model, processed object image data in which the effects of these events appear can be reflected in machine learning and machine learning can be performed on the relationship between these events, and the parameter data and the environmental information. Thus, in a learned model, the simulation accuracy can be improved in comparison with a general physical model.

As described above, a learned model can achieve simulation accuracy that cannot be achieved by a simulator based on a physical model. In addition, a learned model can reduce the simulation time in comparison with a simulator based on a physical model. Further, a learned model has advantages, such as no need to create a rule manually and no need to develop an appropriate physical equation as in a simulator based on a physical model.

Summary

As is obvious from the above description, the learning device according to the first embodiment is configured to:
  obtain the parameter data set to the semiconductor manufacturing device when the wafer to be processed is processed and the environmental information indicating environment during processing of the wafer to be processed that is measured when the wafer to be processed is processed
  obtain the non-processed object image data that is an image representing a shape of the wafer to be processed in the semiconductor manufacturing device before processing
  array the obtained parameter data and the obtained environmental information in two dimensions in accordance with the width and the height of the obtained non-processed object image data to process the obtained parameter data and the obtained environmental information into an image data format, and concatenate the processed parameter data and the processed environmental information with the non-processed object image to generate concatenated data
  perform machine learning by inputting the generated concatenated data into a learning model based on a U-shaped convolutional neural network so that an output result approaches the processed object image data representing a shape of the wafer after processing This enables the learning device according to the first embodiment to reflect factors correlating with events of the manufacturing process in machine learning and to generate a learned model that achieves a highly accurate simulation.

The inference device according to the first embodiment is configured to:
  obtain non-processed object image data, the parameter data, and the environmental information
  array the obtained parameter data and the obtained environmental information in two dimensions in accordance with the width and the height of the obtained non-processed object image data to process the obtained parameter data and the obtained environmental information into an image data format, and concatenate the processed parameter data and the processed environmental information with the non-processed object image to generate concatenated data perform a simulation by inputting the generated concatenated data into the learned model This enables the inference device according to the first embodiment to generate a learned model on which machine learning is performed by using factors correlating with events of the manufacturing process and to achieve a highly accurate simulation.

As described above, according to the first embodiment, in the simulation of the semiconductor manufacturing process, the simulation accuracy can be improved.

Second Embodiment

In the above-described first embodiment, the parameter data and the environmental information are processed into the image data format in accordance with the width and the height of the non-processed object image data, and are concatenated with the non-processed object image data to be input to a learning model (or a learned model).

However, a method of processing the parameter data and the environmental information, and a method of inputting the processed parameter data and the processed environmental information into a learning model (or a learned model) are not limited to this. For example, the processed parameter data and the processed environmental information may be input to each layer of a learning model (or a learned model). When the parameter data and the environmental information are input to each layer of the learning model (or learned model), the parameter data and the environmental information may also be processed into a predetermined format used when the image data on which a convolution operation is performed at each layer of the learning model (or the learned model) is converted. In the following, a second embodiment will be described focusing on differences between the second embodiment and the above-described first embodiment.

Functional Configuration of a Data Shaping Unit

Figure 12:
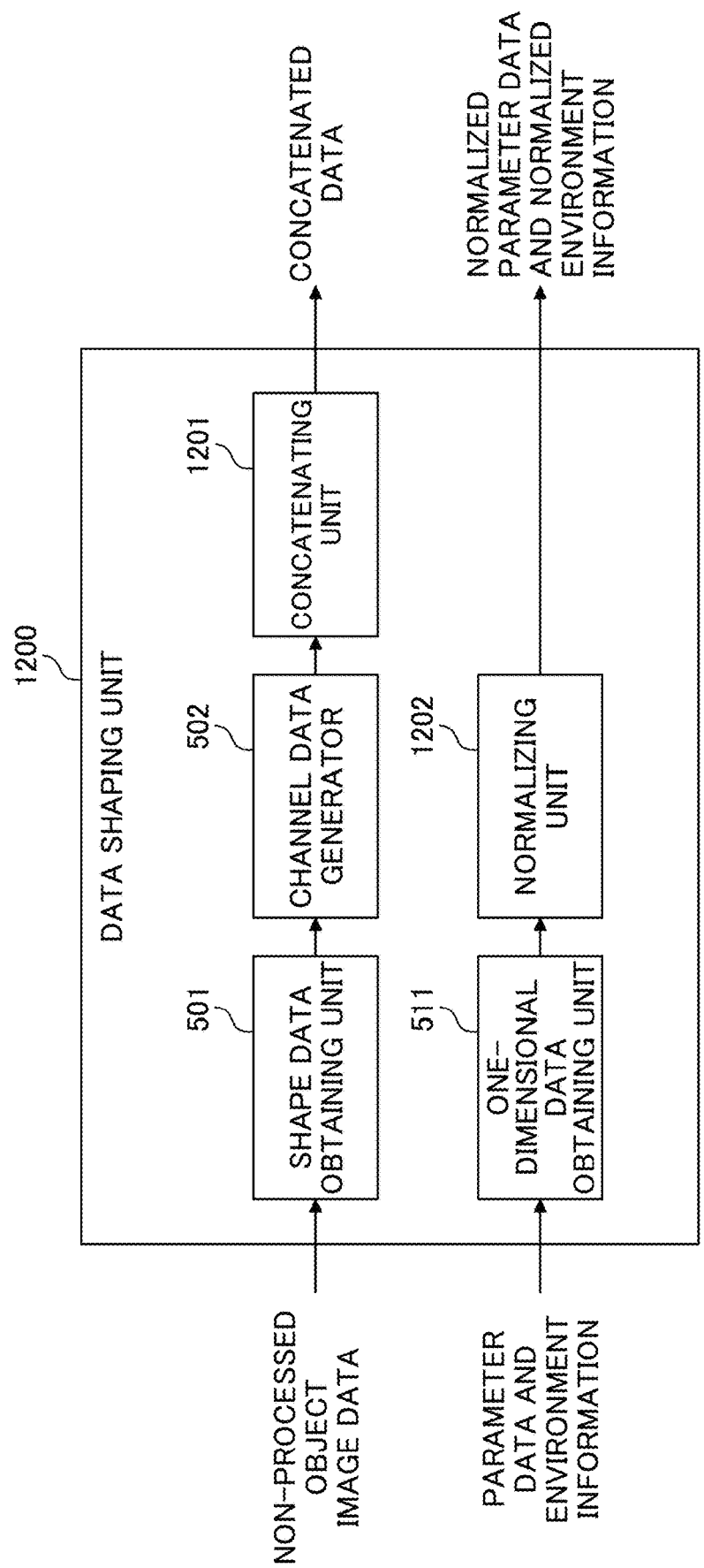
FIG. 12 is a drawing illustrating an example of a functional configuration of a data shaping unit of a learning device according to a second embodiment.

First, a functional configuration of a data shaping unit of the learning device according to the second embodiment will be described in detail. FIG. 12 is a drawing illustrating an example of the functional configuration of the data shaping unit of the learning device according to the second embodiment. A difference between this functional configuration and the functional configuration of the data shaping unit 121 illustrated in FIG. 5 is that a data shaping unit 1200 illustrated in FIG. 12 includes a concatenating unit 1201 and a normalizing unit 1202.

The concatenating unit 1201 concatenates multiple channel data notified from the channel data generator 502 and then generates concatenated data.

The normalizing unit 1202 normalizes the parameter data and the environmental information notified from the one-dimensional data obtaining unit 511 and generates normalized parameter data and normalized environmental information.

Specific Example of a Process Performed by a Learning Model

Figure 13:
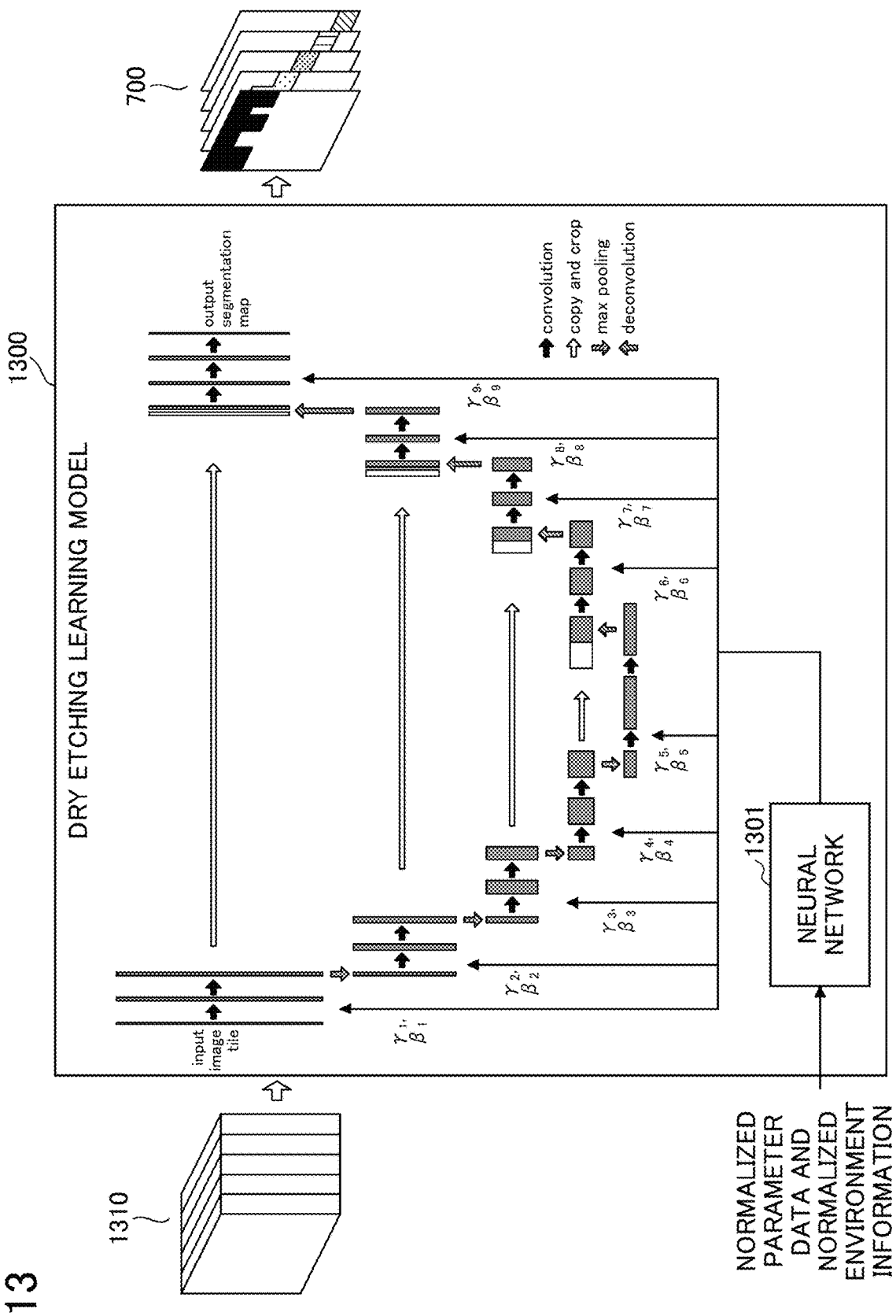
FIG. 13 is a drawing illustrating a specific example of a process performed by a dry etching learning model of the learning device according to the second embodiment.

Next, a specific example of a process performed by a dry etching learning model will be described. FIG. 13 is a drawing illustrating a specific example of the process performed by the dry etching learning model of the learning device according to the second embodiment.

As illustrated in FIG. 13, in the learning device according to the second embodiment, concatenated data 1310 generated by the concatenating unit 1201 of the data shaping unit 1200 is input to a dry etching learning model 1300.

As illustrated in FIG. 13, in the learning device according to the second embodiment, the normalized parameter data and the normalized environmental information that are generated by the normalizing unit 1202 of the data shaping unit 1200 are input to the dry etching learning model 1300.

As illustrated in FIG. 13, the dry etching learning model 1300 includes a neural network 1301 that is a fully connected learning model in addition to the UNET that is a CNN-based learning model.

In response to the normalized parameter data and the normalized environmental information being input, the neural network 1301 outputs predetermined format values (e.g., coefficients γ and β of a linear equation) used to convert a value of each pixel of each image data on which a convolution operation is performed at each layer of the UNET. That is, the neural network 1301 has a function to process the normalized parameter data and the normalized environmental information into a predetermined format (e.g., a format of coefficients of a linear equation).

In the example of FIG. 13, the UNET is composed of nine layers, so that the neural network 1301 outputs (γ1, β1) to (γ9, β9) as coefficients of the linear equation. In the example illustrated in FIG. 13, due to space limitation, a pair of the coefficients of the linear equation is input for each layer, but multiple pairs of the coefficients of the linear equation are input for each layer for each channel data.

In each layer of the UNET, a value of each pixel of image data of each channel data (which is defined as "h" here) on which a convolution operation is performed is converted by using, for example, a linear equation: h×γ+β (i.e., in the first layer, h×$γ_1$+$β_1$).

Here, the coefficients (γ1, β1) to (γ9, β9) of the linear equation can be regarded as an index indicating which image data is important among image data of respective channel data on which a convolution operation is performed in each layer of the UNET, for example. That is, the neural network 1301 performs a process of calculating an index indicating the importance of each image data processed at each layer of the learning model based on the normalized parameter data and the normalized environmental information.

Under the above-described configuration, when the concatenated data 1310, the normalized parameter data, and the normalized environmental information are input to the dry etching learning model 1300, the output result 700 including multiple channel data is output. The output result 700 is compared with the processed object image data by the comparing unit 430 and differential information is calculated. In the learning device according to the second embodiment, the modifying unit 440 updates model parameters of the UNET and model parameters of the neural network 1301 in the dry etching learning model 1300 based on the differential information.

As described above, the learning device according to the second embodiment can extract highly important image data in each layer of the UNET based on the normalized parameter data and the normalized environmental information when machine learning is performed on the dry etching learning model 1300.

Summary

As is clear from the above description, the learning device according to the second embodiment is configured to:

obtain the parameter data set to the semiconductor manufacturing device when the wafer to be processed is processed and the environmental information indicating environment during processing of the wafer to be processed that is measured when the wafer to be processed is processed obtain the non-processed object image data that is an image representing a shape of the wafer to be processed in the semiconductor manufacturing device before processing normalize the obtained parameter data and the obtained environmental information to process the obtained parameter data and the obtained environmental information into a coefficient format of a linear equation used to convert a value of each pixel of each image data on which a convolution operation is performed in each layer of the learning model convert the value of each pixel of each image data on which a convolution operation is performed in each layer by using the linear equation when the learning unit performs machine learning This enables the learning device according to the second embodiment to reflect factors correlating with events of the manufacturing process in machine learning and to generate a learned model that achieves a highly accurate simulation.

Although the learning device has been described in the second embodiment, when the executing unit performs a simulation in the inference device, substantially the same process is performed.

Third Embodiment

In the first and second embodiments described above, when the learning unit performs machine learning, a constraint condition specific to the semiconductor manufacturing process is not particularly mentioned. However, constraint conditions specific to the semiconductor manufacturing process exist, and the simulation accuracy can be further improved by reflecting a specific constraint condition in machine learning performed by the learning unit (i.e., by reflecting domain knowledge in machine learning performed by the learning unit). In the following, a third embodiment in which domain knowledge is reflected will be described focusing on differences between the third embodiment and the first and second embodiments described above.

Details of a Functional Configuration of the Learning Model

Figure 14:
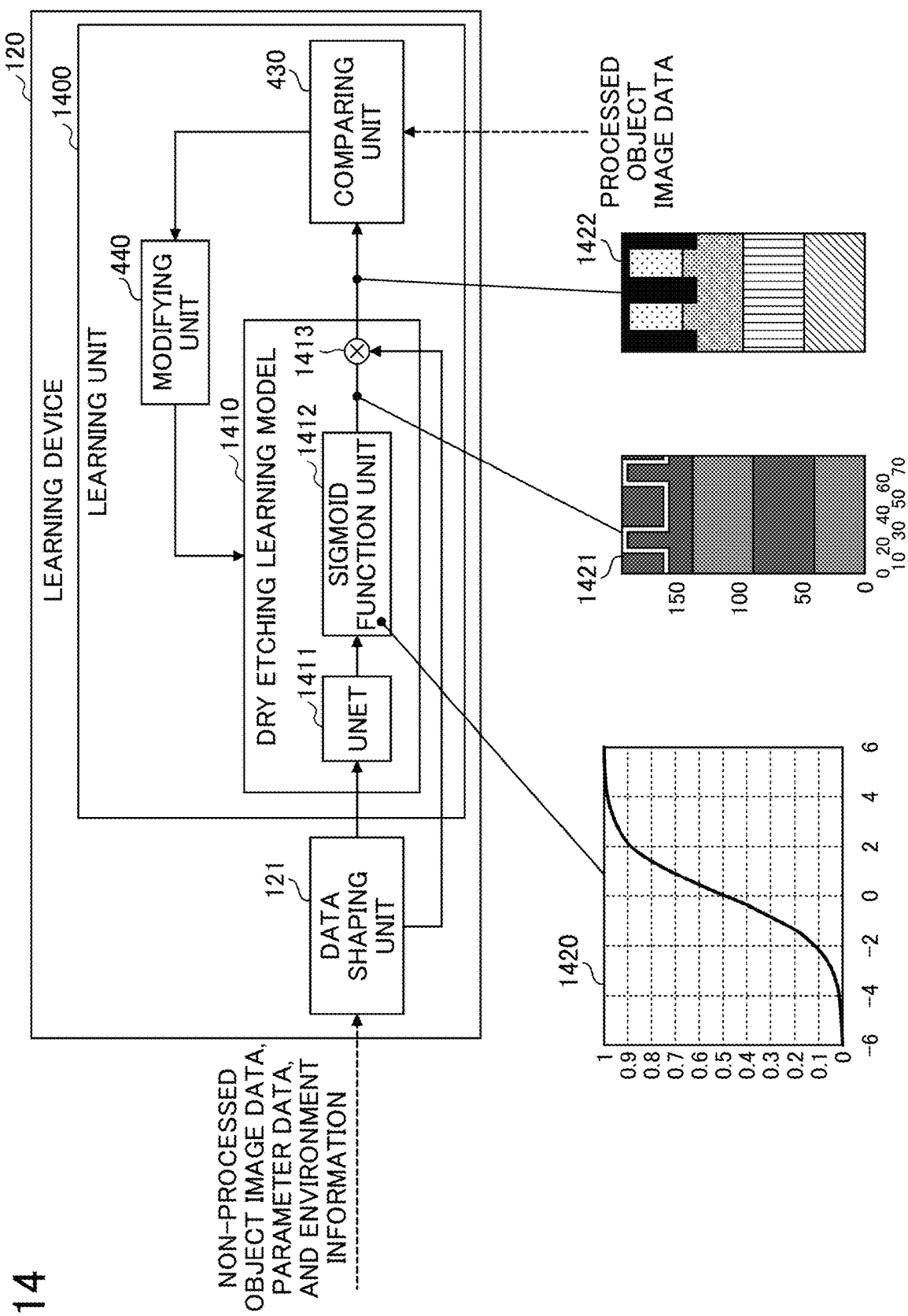
FIG. 14 is a drawing illustrating an example of a functional configuration of a learning unit of a learning device according to a third embodiment.

FIG. 14 is a drawing illustrating an example of a functional configuration of a learning unit of a learning device according to the third embodiment. An internal configuration within the learning model differs from the functional configuration of the learning unit 122 illustrated in FIG. 4. Here, the internal configuration within the learning model will be described using the dry etching learning model 1410, but the deposition learning model has substantially the same internal configuration.

As illustrated in FIG. 14, the dry etching learning model 1410 in the learning unit 1400 includes a sigmoid function unit 1412 and a multiplier 1413 in addition to the UNET 1411.

The sigmoid function unit 1412 is an example of a processing unit. As illustrated in FIG. 14, a first output result that is an output of the UNET 1411 is converted by a sigmoid function 1420 to output a second output result 1421.

The multiplier 1413 obtains the second output result 1421 from the sigmoid function unit 1412. The multiplier 1413 obtains the non-processed object image data from the data shaping unit 121. The multiplier 1413 multiplies the obtained non-processed object image data by the obtained second output result 1421 to notify a final output result 1422 to the comparing unit 430.

As described above, the dry etching learning model 1410 is configured to output the final output result 1422 by multiplying the non-processed object image data, so that the image data representing the etch ratio is output from the UNET 1411 as the first output result when machine learning is performed on the dry etching learning model 1410.

Here, the etch rate indicates a value of the change rate that indicates how much a layer of each material included in the non-processed object image data has been etched in the processed object image data. By performing machine learning on the dry etching learning model 1410, the etch rate approaches a value obtained by dividing the processed object image data by the non-processed object image data. However, the first output result output from the UNET 1411 during machine learning may be any value.

In dry etching, there is a constraint condition (i.e., domain knowledge) that "materials do not increase over the course of processing" with respect to the change in shape. Thus, in dry etching, the etch rate is within the range from 0 to 1.

Here, the sigmoid function unit 1412 is a function that converts any value to a value from 0 to 1, and the above-described domain knowledge can be reflected by the sigmoid function unit 1412 converting the first output result to the second output result.

Although not illustrated in FIG. 14, substantially the same process can be performed in the deposition learning model by providing the sigmoid function unit, the multiplier, and the like. Specifically, as the first output result, image data representing the deposition rate is output from the UNET when machine learning is performed on the deposition learning model.

Here, the deposition rate indicates a value of the change rate that indicates how much a thin film is deposited in the processed object image data for a layer of each material included in the non-processed object image data. By performing machine learning on the deposition learning model, the deposition rate approaches a value obtained by dividing a difference between the non-processed object image data and the processed object image data by the non-processed object image data. However, the first output result output from the UNET during machine learning may be any value.

In deposition, there is a constraint condition (i.e., domain knowledge) that "materials do not decrease over the course of processing" with respect to the change in shape. Thus, in deposition, the deposition rate is within the range from 0 to 1.

As described above, the sigmoid function unit is a function that converts any value to a value from 0 to 1, and the domain knowledge can be reflected by the sigmoid function unit converting the first output result to the second output result.

As described above, according to the learning unit 1400 of the learning device 120 of the third embodiment, the domain knowledge can be reflected in the machine learning, and the simulation accuracy can be further improved.

Fourth Embodiment

In the first to third embodiments described above, the data shaping unit generates the concatenated data having a height and a width in accordance with the height and width of the non-processed object image data. However, the width and the height of the concatenated data generated by the data shaping unit are determined as desired, and the data shaping unit may be configured to compress the non-processed object image data and generate the concatenated data. In the following, a fourth embodiment will be described focusing on differences between the fourth embodiment and the first to third embodiments described above.

Details of a Functional Configuration of a Data Shaping Unit

Figures 15A, 15B:
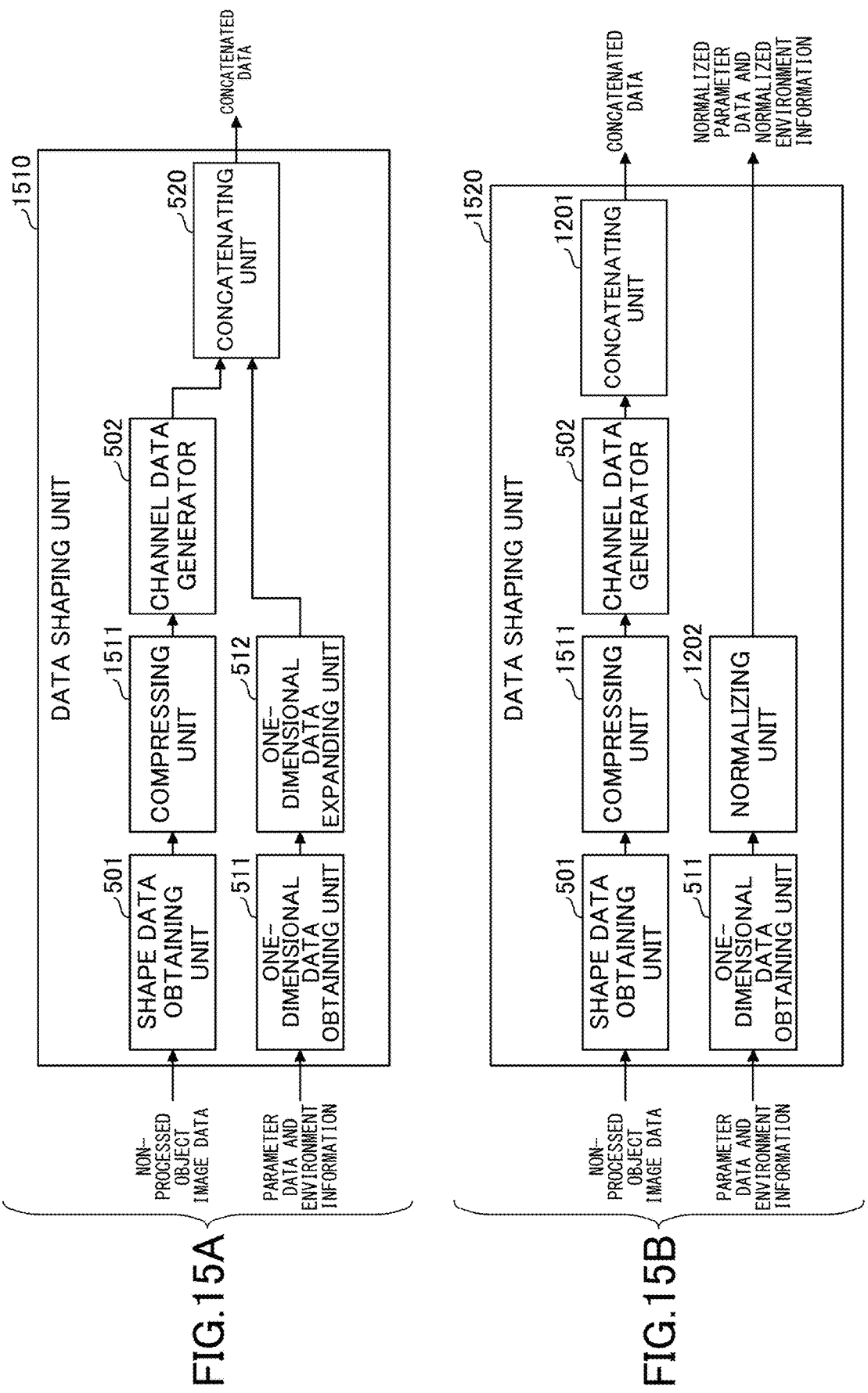
FIG. 15A and FIG. 15B are drawings illustrating an example of a functional configuration of a data shaping unit of a learning device according to a fourth embodiment.

FIG. 15A and FIG. 15B are drawings illustrating an example of a functional configuration of a data shaping unit of a learning device according to the fourth embodiment. FIG. 15A illustrates a data shaping unit 1510 in which a compressing unit 1511 is added to the data shaping unit 121 of the learning device according to the first embodiment.

The compressing unit 1511 compresses the non-processed object image data obtained by the shape data obtaining unit 501. The compressing unit 1511, for example, calculates an average value of pixel value of n adjacent pixels (n is an integer that is two or greater; for example, n=4 indicates two pixels in the vertical direction and two pixels in the horizontal direction), and the calculated average value is defined as a pixel value of one pixel that groups the n pixels. This enables the compressing unit 1511 to compress the non-processed object image data by a factor of 1/n.

As described above, the compressing unit 1511 performs a compression process so that the composition ratio (or the content ratio) of the materials is maintained as much as possible over the course of compression in view of the fact that the non-processed object image data is image data representing the composition ratio (or the content ratio) of the materials. The compression rate of the compression process performed by the compressing unit 1511 is not limited to an integer multiple, and in the compressing unit 1511, the compression process can be performed with a desired compression rate.

Similarly, FIG. 15B illustrates a data shaping unit 1520 in which a compressing unit 1511 is added to the data shaping unit 1200 of the learning device according to the second embodiment.

The compressing unit 1511 included in the data shaping unit 1520 has substantially the same function as the compressing unit 1511 included in the data shaping unit 1510. Thus, the detailed description is omitted here.

As described above, by adding the compressing unit 1511 to the data shaping unit 1510 or 1520, the size of the concatenated data that is input to the learning units 122 and 1400 (or the executing unit 132) can be reduced. As a result, according to the fourth embodiment, a learning time period required when the learning units 122 and 1400 perform machine learning or a simulation time period required when the executing unit 132 performs the simulation can be reduced.

Other Embodiments

In the first embodiment described above, the dry etching learning model 420 and the deposition learning model 421 are provided in the learning unit 122, and machine learning is performed separately using different training data.

However, dry etching and deposition may be simultaneously performed in a semiconductor manufacturing process. Assuming such a case, one learning model may be provided in the learning unit 122 so that machine learning can be performed with respect to a case in which dry etching and deposition are performed simultaneously.

In this case, the learning unit 122 performs machine learning on the one learning model by using training data including non-processed object image data before dry etching and deposition are performed and processed object image data after dry etching and deposition are performed.

As described above, in a typical physical model, the simulator is required to be separately provided in dry etching and deposition. However, in a learning model, the simulator can be integrated.

In the above-described first embodiment, the data shaping unit 121 processes both the parameter data and the environmental information in a predetermined format and inputs the parameter data and the environmental information to a corresponding learning model. However, the data shaping unit 121 may process only the parameter data into a predetermined format and input the parameter data to a corresponding learning model. That is, when the machine learning is performed on the learning model by the learning unit 122, only the parameter data may be used without using the environmental information.

Similarly, in the above-described first embodiment, the data shaping unit 131 processes both the parameter data and the environmental information into a predetermined format and inputs the parameter data and the environmental information to a corresponding learned model. However, the data shaping unit 131 may process only the parameter data into a predetermined format and input the parameter data to a corresponding learned model. That is, when the simulation is performed using the learned model by the executing unit 132, only the parameter data may be used and the environmental information is not used.

In the above-described first embodiment, the non-processed object image data and the processed object image data are two-dimensional image data. However, the non-processed object image data and the processed object image data are not limited to the two-dimensional image data, but may be three-dimensional image data (which is what is called voxel data).

If the non-processed object image data is two-dimensional image data, the concatenated data is an array of the number×channels×width×height. If the non-processed object image data is three-dimensional image data, the concatenated data is an array of the number of channels×width×height×depth.

In the above-described first embodiment, the two-dimensional image data is handled as it is. However, the two-dimensional image data may be modified and handled or the three-dimensional image data may be modified and handled. For example, the three-dimensional image data may be obtained and two-dimensional image data of a predetermined cross section may be generated and may be input as the non-processed object image data. Alternatively, three-dimensional image data may be generated based on two-dimensional image data of successive predetermined cross sections and may be input as the non-processed object image data.

In the above-described first embodiment, the channel data generator 502 generates channel data for a layer of air and respective layers of materials. However, a method of generating the channel data is not limited to this, but the channel data may be generated based on larger classifications, such as oxides, silicon, organics, and nitrides, rather than based on specific film types.

In the first to fourth embodiments described above, the inference device 130 outputs the processed object image data and terminates the processing in response to the non-processed object image data, the parameter data, and the environmental information being input. However, a configuration of the inference device 130 is not limited to this. For example, the processed object image data output in response to the non-processed object image data, the parameter data, and the environmental information being input may be input again to the inference device 130 together with the corresponding parameter data and environmental information. This enables the inference device 130 to continuously output shape changes. The corresponding parameter data and environmental information can be changed as desired when the processed object image data is input to the inference device 130 again.

In the first to fourth embodiments described above, no specific example application of the inference device 130 has been particularly mentioned. However, the inference device 130 may be applied to, for example, services provided to semiconductor manufacturers for searching an optimal recipe, optimal parameter data, and an optimal hardware configuration.

Figure 16:
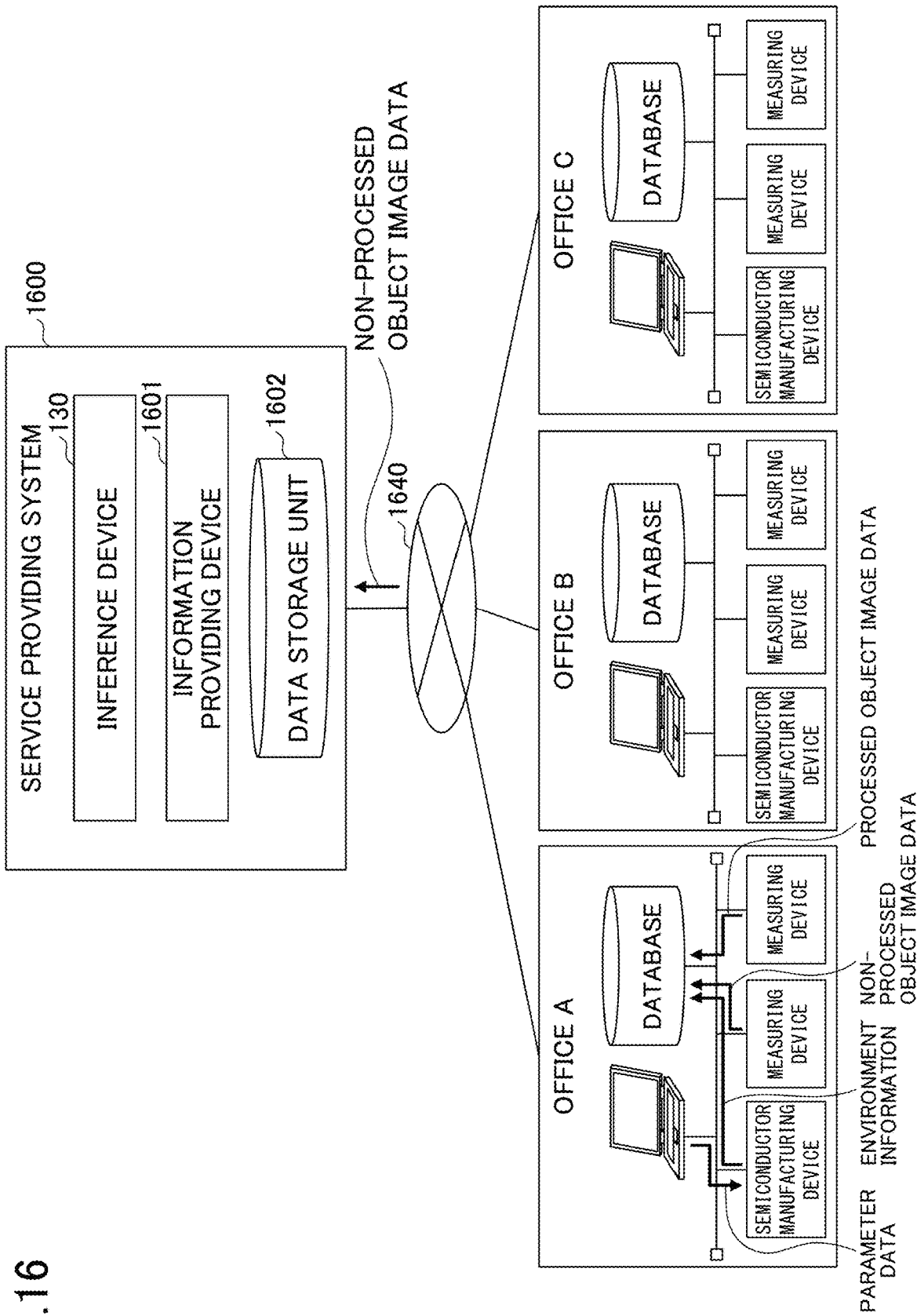
FIG. 16 is a drawing illustrating an application example of the inference device.

FIG. 16 is a drawing illustrating an example application of the inference device and illustrates an example in which the inference device 130 is applied to a service providing system 1600.

The service providing system 1600, for example, connects to each office of a semiconductor manufacturer through a network 1640 to obtain non-processed object image data. The service providing system 1600 stores the obtained non-processed object image data in a data storage unit 1602.

The inference device 130 reads the non-processed object image data from the data storage unit 1602 and performs a simulation while changing the parameter data and the environmental information. This enables a user of the inference device 130 to search for an optimal recipe, optimal parameter data, or an optimal hardware configuration.

The information providing device 1601 provides the optimal recipe and the optimal parameter data searched by the user of the inference device 130 to each branch of the semiconductor manufacturer.

As described above, by applying the inference device 130 to the service providing system 1600, the service providing system 1600 can provide the optimal recipe and the optimal parameter data for the semiconductor manufacturer.

In the first to fourth embodiments described above, the wafer to be processed is an object, but the object is not limited to the wafer to be processed, and may be, for example, a chamber inner wall of the semiconductor manufacturing device 110, a surface of a part, or the like.

In the first to fourth embodiments described above, a case in which the measuring device 111 (or the measuring device 112) generates the non-processed object image data (or the processed object image data) has been described. However, the non-processed object image data (or the processed object image data) is not limited to image data generated by the measuring device 111 (or the measuring device 112). For example, the measuring device 111 (or the measuring device 112) may be configured to generate multidimensional measurement data representing the shape of an object and the learning device 120 may be configured to generate the non-processed object image data (or the processed object image data) based on the measurement data.

The measurement data generated by the measuring device 111 (or the measuring device 112) includes, for example, data including position information and film type information. Specifically, the measurement data includes data that is generated by the CD-SEM and that combines position information and CD length measurement data. Alternatively, the measurement data includes data that is generated by X-ray or Raman method and that combines two-dimensional or three-dimensional shape and information about film types and the like. That is, the multidimensional measurement data representing the shape of an object includes various expression forms in accordance with types of measuring devices.

In the first to fourth embodiments described above, the learning device 120 and the inference device 130 are illustrated separately, but may be configured as a single unit.

In the first to fourth embodiments described above, one computer constitutes the learning device 120, but multiple computers may constitute the learning device 120. Similarly, in the first to fourth embodiments described above, one computer constitutes the inference device 130, but multiple computers may constitute the inference device 130.

In the first to fourth embodiments described above, the learning device 120 and the inference device 130 have been applied to a semiconductor manufacturing process, but it is needless to say that they may be applied to processes other than a semiconductor manufacturing process. The processes other than a semiconductor manufacturing process include manufacturing processes other than a semiconductor manufacturing process and non-manufacturing processes.

In the first to fourth embodiments described above, the learning device 120 and the inference device 130 are achieved by causing a general-purpose computer to execute various programs, but a method of achieving the learning device 120 and the inference device 130 is not limited to this.

For example, the learning device 120 and the inference device 130 may be achieved by a dedicated electronic circuit (i.e., hardware), such as an integrated circuit (IC) that implements a processor, memory, and the like. Multiple components may be implemented in one electronic circuit, one component may be implemented in multiple electronic circuits, and components and electronic circuits may be implemented on a one-to-one basis.

It should be noted that the present invention is not limited to the above-described configurations, such as the configurations described in the above-described embodiments, and combinations with other elements. In these respects, various modifications can be made within the scope of the invention without departing from the spirit of the invention, and the configurations may be appropriately determined according to an application form.

What is claimed is:

1. An inference method performed by at least one processor, the method comprising:

inputting, by the at least one processor, into a learned model, non-processed object image data of a second object and data related to a second process for the second object, and inferring, by the at least one processor using the learned model, processed object image data of the second object on which the second process has been performed, wherein the learned model has been trained so that an output obtained in response to non-processed object image data of a first object and data related to a first process for the first object being input approaches processed object image data of the first object on which the first process has been performed.

2. The inference method as claimed in claim 1, further comprising:
processing, by the at least one processor, the data related to the second process into a format in accordance with the non-processed object image data of the second object,
wherein the inputting of the non-processed object image data of the second object and the data related to the second process inputs the processed data related to the second process into the learned model.

3. The inference method as claimed in claim 2, wherein the format in accordance with the non-processed object image data of the second object is a two-dimensional array in accordance with a width and a height of the non-processed object image data of the second object.

4. The inference method as claimed in claim 1, wherein the non-processed object image data of the second object input into the learned model has a plurality of channels corresponding to materials included in the second object.

5. The inference method as claimed in claim 1, further comprising:
inputting, by the at least one processor, the processed object image data of the second object and data related to a third process into the learned model, and
inferring, by the at least one processor using the learned model, processed object image data of the second object on which the second process and the third process have been performed.

6. The inference method as claimed in claim 1, wherein the first process and the second process are of a same type.

7. The inference method as claimed in claim 1, wherein the learned model includes a neural network.

8. The inference method as claimed in claim 7, wherein the neural network outputs the processed object image data of the second object.

9. The inference method as claimed in claim 7, wherein the processed object image data of the second object is generated based on the non-processed object image data of the second object and an output of the neural network.

10. The inference method as claimed in claim 9, wherein the neural network outputs information related to a change rate relative to the non-processed object image data of the second object.

11. The inference method as claimed in claim 1, wherein each of the first process and the second process is a process corresponding to a semiconductor manufacturing process.

12. The inference method as claimed in claim 11, wherein the process corresponding to the semiconductor manufacturing process includes at least one of etching or deposition.

13. The inference method as claimed in claim 11, wherein the data related to the second process includes information related to a parameter indicating a processing condition when a semiconductor manufacturing device performs the process corresponding to the semiconductor manufacturing process.

14. The inference method as claimed in claim 11, wherein the data related to the second process includes environmental information measured when a semiconductor manufacturing device performs the process corresponding to the semiconductor manufacturing process.

15. The inference method as claimed in claim 13, wherein the parameter includes at least one of a value set to the semiconductor manufacturing device or a hardware configuration of the semiconductor manufacturing device.

16. The inference method as claimed in claim 14, wherein the environmental information includes at least one of data related to a current, data related to voltage, data related to light, data related to a temperature, or data related to pressure that are measured in the semiconductor manufacturing device.

17. An inference device comprising:
at least one memory; and
at least one processor,
wherein the at least one memory stores a learned model that has been trained so that an output obtained in response to non-processed object image data of a first object and data related to a first process for the first object being input approaches processed object image data of the first object on which the first process has been performed, and
wherein the at least one processor is configured to:
input, into the learned model, non-processed object image data of a second object and data related to a second process for the second object, and
infer, by using the learned model, processed object image data of the second object on which the second process has been performed.

18. The inference device as claimed in claim 17, wherein the at least one processor is further configured to:
input, into the learned model, the processed object image data of the second object and data related to a third process, and
infer, by using the learned model, processed object image data of the second object on which the second process and the third process have been performed.

19. A model generating method performed by at least one processor, the method comprising training a learning model so that an output of the learning model in response to non-processed object image data of an object and data related to a process for the object being input into the learning model approaches processed object image data of the object on which the process has been performed.

20. A learning device comprising:
at least one memory; and
at least one processor configured to train a learning model so that an output of the learning model in response to non-processed object image data of an object and data related to a process for the object being input into the learning model approaches processed object image data of the object on which the process has been performed.

* * * * *